(12) United States Patent
Kisu et al.

(10) Patent No.: US 6,501,116 B2
(45) Date of Patent: Dec. 31, 2002

(54) SEMICONDUCTOR MEMORY DEVICE WITH MIS TRANSISTORS

(75) Inventors: Teruaki Kisu, deceased, late of Tokyo (JP), by Teruo Kisu, Haruko Kisu, legal representatives; Kazuo Nakazato, Cambridge (GB); Masahito Takahashi, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/026,769

(22) Filed: Dec. 27, 2001

(65) Prior Publication Data

US 2002/0098639 A1 Jul. 25, 2002

(30) Foreign Application Priority Data

Dec. 28, 2000 (JP) ........................................ 2000-401596

(51) Int. Cl.[7] .............................................. H01L 27/08
(52) U.S. Cl. ...................... 257/296; 257/295; 257/298; 365/145; 365/149
(58) Field of Search ................................ 257/296, 298, 257/295, 306, 392; 365/51, 52, 53, 145, 149

(56) References Cited

U.S. PATENT DOCUMENTS 5,990,507 A * 11/1999 Mochizuki et al. ......... 257/295
6,011,285 A * 1/2000 Hsu et al. .................... 257/295
6,314,017 B1 * 11/2001 Emori et al. ................ 257/296
6,327,172 B1 * 12/2001 Ishiwara ...................... 365/145

FOREIGN PATENT DOCUMENTS

JP 2000-113683 4/2000 ........... G11C/14/00

OTHER PUBLICATIONS

Patent Abstracts of Japan, 2000–113683, filed Apr. 21, 2000.

* cited by examiner

*Primary Examiner*—David Nelms
*Assistant Examiner*—Long Tran
(74) *Attorney, Agent, or Firm*—Antonelli, Terry, Stout & Kraus, LLP

(57) ABSTRACT

Disclosed are a gain cell structure capable of making a memory cell compact in size and a method of manufacturing the same at low cost. A memory cell is constituted of a reading MIS transistor and a writing MIS transistor. The reading MIS transistor has a pair of $n^+$ type semiconductor regions (source region and drain region) formed on a main surface of a semiconductor substrate and a first gate electrode formed on a path of the $n^+$ type semiconductor regions 13 via a first gate insulating film. The writing MIS transistor is arranged on the reading MIS transistor and has a layered structure made by laminating a lower semiconductor layer (source region), an intermediate semiconductor layer (channel forming region), and an upper semiconductor layer (drain region) in this order. The writing MIS transistor has a vertical structure in which a second gate electrode is arranged on both sidewalls of the layered structure via a second gate insulating film.

16 Claims, 27 Drawing Sheets

Fig. 3
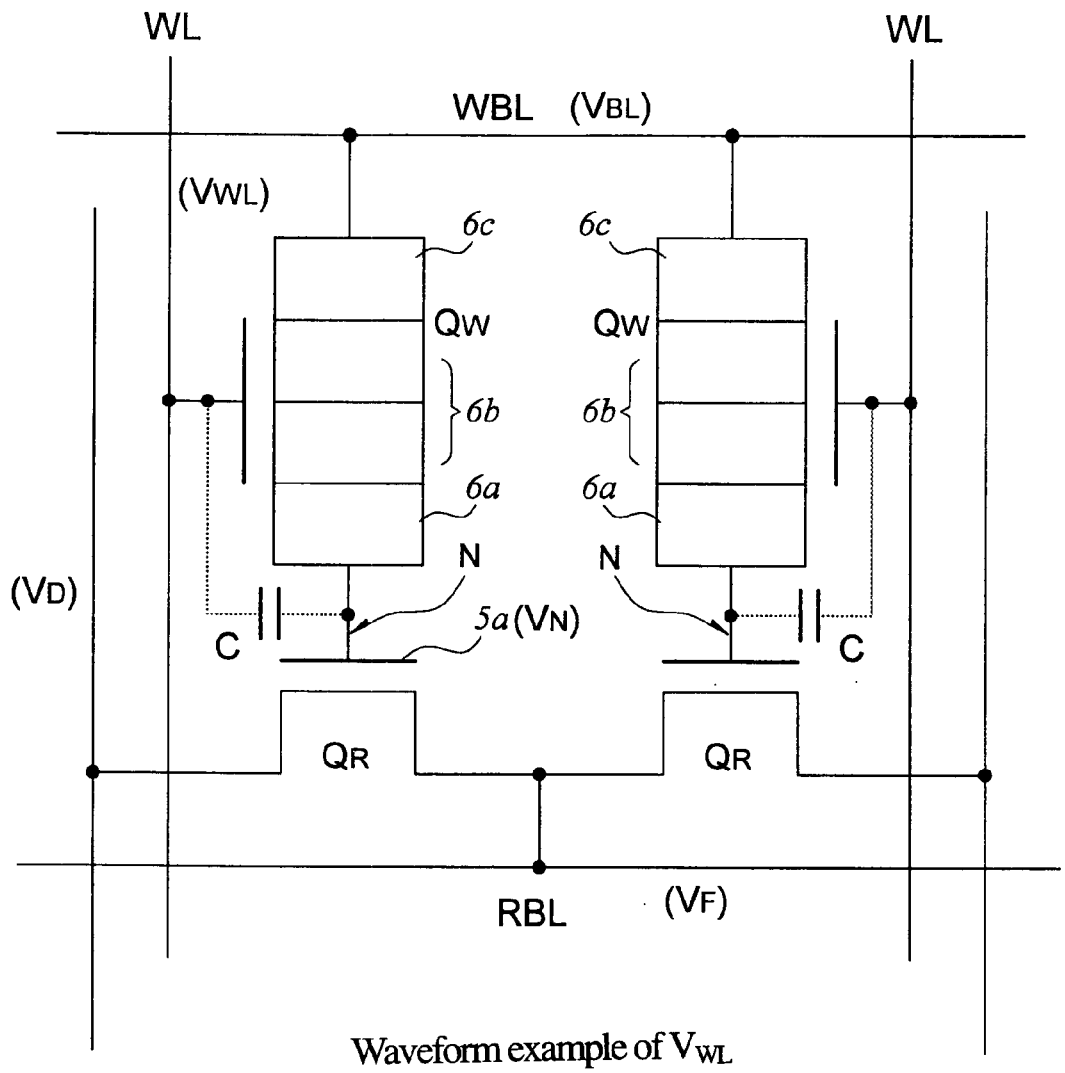
Waveform example of $V_{WL}$
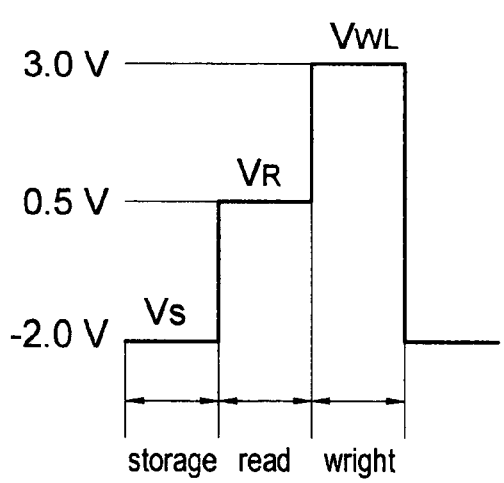

SEMICONDUCTOR MEMORY DEVICE WITH MIS TRANSISTORS

TECHNICAL FIELD OF THE INVENTION

The present invention relates to a semiconductor memory device and a method of manufacturing the same. Particularly, the present invention relates to a technique effectively applicable to a semiconductor memory device in which a memory cell is constituted of a reading MIS transistor formed on a main surface of a semiconductor substrate and a writing MIS transistor formed on the reading MIS transistor.

BACKGROUND OF THE INVENTION

Recently, as a general large-capacity semiconductor memory, DRAM (Dynamic Random Access Memory) having a memory cell constituted of a MOS transistor and a capacitor (capacitor element) has been mainly used.

Also, as an alternative semiconductor memory to the DRAM, the inventors of this application have developed, what is called, a three-dimensional semiconductor memory called a gain cell constituted of two MOS transistors as described in Japanese Patent Application Laid-Open No. 2000-113683, in which a source-drain path of a reading MOS transistor is formed in a semiconductor bulk of a main surface of a semiconductor substrate, and a writing MOS transistor having a layered structure formed by laminating a source semiconductor layer, a channel forming semiconductor layer, and a drain semiconductor layer on the main surface of the semiconductor substrate in a vertical direction is joined onto a gate electrode of this reading MOS transistor. Since the gain cell is a memory cell having a three-dimensional structure, in which the gate electrode of the reading MOS transistor having an extremely small leak current is used as a storage node, the memory cell capable of stably operating at high speed can be provided. In addition, the memory cell is scarcely influenced by the leakage carrier from the semiconductor bulk based on alpha rays or the like, and the reduction of the stored charge amount can be repressed. Therefore, this memory cell can be used also as a non-volatile memory.

SUMMARY OF THE INVENTION

The conventional DRAM as described above is suitable to attain the fine fabrication and large capacity because the memory cell of the DRAM is constituted of the minimum components, that is, a MOS transistor and a capacitor.

In recent years, however, as measures for compensating the decrease of the stored charge amount caused by the fine fabrication of the memory cell, a DRAM has been required in which a capacitor arranged on a MOS transistor is made three-dimensional to expand the surface area thereof, alternatively, a deep trench is made on a substrate to form a capacitor therein. Consequently, fine processing thereof has become increasingly difficult.

Also, it is conceived that it is difficult to compensate the reduction of the stored charge amount even if the capacitor only is made three-dimensional. Therefore, the adoption of high dielectric (ferroelectric) materials such as strontium titanate (STO) and barium strontium titanate (BST) as a dielectric film of a capacitor has been currently under consideration. However, additional capital investment is required in order to introduce such novel, high dielectric (ferroelectric) materials into the manufacturing process, which may cause a problem of the increase in the manufacturing cost.

On the other hand, since the gain cell of the three-dimensional structure has a small leak current, a memory cell can be constituted of a capacitor having relatively small capacity. Therefore, the semiconductor memory device of high density and large capacity can be provided. The inventors of this application carried out the studies on the semiconductor memory device having the memory cell of the three-dimensional structure as described above so as to improve the structure and the manufacturing method thereof.

Therefore, it is an object of the present invention to provide a semiconductor memory device having a memory cell of a three-dimensional structure, which is easily made fine.

It is another object of the present invention to provide a technique for manufacturing the semiconductor memory device at low cost.

The above described and other objects and the novel characteristic of the present invention will be apparent by the description and the accompanying drawings of this specification.

Among the inventions disclosed in this application, the outline of the representing one will be described as follows.

A semiconductor memory device of the present invention includes a memory array region formed of a plurality of memory cells arranged in matrix on a main surface of a semiconductor substrate, wherein each of the plurality of memory cells includes:

a reading MIS transistor having a source region and a drain region formed on the main surface of the semiconductor substrate, and a first gate electrode formed above the main surface of the semiconductor substrate via a first gate insulating film; and a writing MIS transistor, which is electrically connected to and arranged on the first gate electrode of the reading MIS transistor, the writing MIS transistor having a source region, a channel forming region, and a drain region formed to be a layered structure extending in a vertical direction to the main surface of the semiconductor substrate, and a second gate electrode formed on a sidewall of the layered structure via a second gate insulating film.

According to the device described above, the layered structure of the writing MIS transistor can be arranged so as to form a convex shape or a trapezoid shape on a part of a first gate electrode of the reading MIS transistor.

According to the device described above, since the memory cell is constituted of the reading MIS transistor and the writing MIS transistor having the vertical structure and arranged on the reading MIS transistor, the memory cell which can be easily made fine can be realized.

Also, since the writing MIS transistor is arranged on the first gate electrode of the reading MIS transistor, a pn junction of the semiconductor bulk is not connected to a storage node. Therefore, in the state where the writing MIS transistor is in the OFF state (cutoff state), the storage node is not affected by the leak current caused from the pn junction of the semiconductor bulk due to the influence of the alpha rays or the like. In addition, electrical leakage paths other than the source-drain path of the writing MIS transistor can be removed. According to the foregoing, the holding characteristic of the stored data can be improved without using the large-capacity capacitor.

Also, in the state where the writing MIS transistor is in the cutoff state (OFF state), since the stored data is held by the gate electrode of the reading MIS transistor, it is possible to increase a signal voltage by adding a gain to a memory cell. Therefore, high-speed reading of data is enabled.

According to a method of manufacturing a semiconductor memory device having the above-described memory cell structure of the present invention, the method includes the steps as follows. That is, (a) putting a channel forming region of each row between a pair of rows adjacent to each other in a memory array region of the main surface of the semiconductor substrate, and forming a plurality of element isolation regions so as to define the source region and the drain region of the reading MIS transistor;

(b) forming a first gate electrode of the reading MIS transistor and a layered structure such that the first gate electrode and the layered structure are arranged in matrix at positions corresponding to each row and each column and extend in the column direction intermittently, the first gate electrode being formed on the channel forming region of each row via the first gate insulating film such that both end portions thereof in the column direction terminate on the element isolation region, and the layered structure including a lower semiconductor layer constituting a source region of the writing MIS transistor deposited on the upper surface of the first gate electrode, an intermediate semiconductor layer constituting a channel forming region, and an upper semiconductor layer constituting a drain region;

(c) introducing impurities into the semiconductor substrate with using the layered structure and the element isolation region as a mask, thus forming a source region and a drain region of the reading MIS transistor;

(d) forming a first interlayer insulating film on the semiconductor substrate so as to fill a gap between the plurality of layered structures arranged in matrix;

(e) forming a first conductive layer so as to be electrically connected to an upper surface of the plurality of layered structures exposed from the first interlayer insulating film and so as to cover the upper surface of the first interlayer insulating film;

(f) performing the etching of the first conductive layer, thus forming a first bit line, which extends in the row direction across the upper surface of the plurality of layered structures positioned in each row and is electrically connected to each of the upper semiconductor layer of the plurality of layered structures;

(g) performing the etching of the plurality of layered structures positioned below the first bit line such that the width of the layered structure corresponds to that of the first bit line and until the etching reaches the first gate electrode of the reading MISFET, thus exposing sidewalls of each of the plurality of layered structures;

(h) forming a second gate insulating film on the sidewall of each of the plurality of layered structures exposed in the step (g), thus forming a second conductive layer so as to cover the sidewall portion and the upper portion of the first bit line; and (i) performing the etching of the second conductive layer, thus forming a second gate electrode of the writing MIS transistor, which extends in the column direction across the upper portion of the plurality of layered structures positioned in each column and covers each of the sidewall portions of the plurality of layered structures.

According to the manufacturing method described above, in the step (b), the layered structure of the writing MIS transistor is formed on the first gate electrode of the reading MIS transistor having end portions terminating on the element isolation regions. Therefore, even if the layered structure and the element isolation region are shifted in position from each other on the first gate electrode, since the first gate electrode certainly functions as a mask for the source and drain impurities in the impurity introduction step into the source region and drain region of the step (c), the introduction of the impurities causing the short-circuit between the source-drain is prevented.

According to the manufacturing method of the present invention, the layered structure of the writing MIS transistor is made by depositing lamination films of a semiconductor material, for example, polycrystalline silicon on a main surface of a semiconductor substrate by the CVD technique, and the layered structure thus obtained can be cut at a time on the first gate electrode of the reading MIS transistor by the patterning technique. Therefore, the layered structure of the writing MIS transistor, that is, the source-drain path can be easily formed.

According to the manufacturing method of the present invention, in the layered structure of the writing MIS transistor, the intermediate semiconductor layer constituting the channel forming region can be easily formed as the one including the two-layered film, that is, a semiconductor film and a tunnel insulating film by alternately depositing the semiconductor film and the thin insulating film serving as the tunnel film. By doing so, the leak current between the source and the drain can be reduced when the transistor is in the OFF state (cutoff state). In this case, if the semiconductor film constituting the intermediate semiconductor layer is made of the pure semiconductor having substantially no impurities therein, the leak current in the source-drain path when the writing MIS transistor is in the OFF state can be further reduced.

According to the method described above, a memory cell is realized by using only the already-existing materials and the process technique thereof and not using any novel material. Therefore, the semiconductor memory device having a fine memory cell structure can be realized at low cost.

Other characteristic of the present invention in addition to the foregoing will be further understood by the concrete description based on the embodiments below.

BRIEF DESCRIPTION OF THE DRAWINGS

FIG. 3 is an equivalent circuit diagram showing a memory cell of the semiconductor memory device according to the embodiment of the present invention;

DESCRIPTION OF THE PREFERRED EMBODIMENTS

Hereinafter, embodiments of the present invention will be described in detail based on the accompanying drawings. Note that, in all of the drawings for describing the embodiments, components having the same function are denoted by the same reference symbol and the repetitive description therefor will be omitted.

(First Embodiment)

Figure 1:
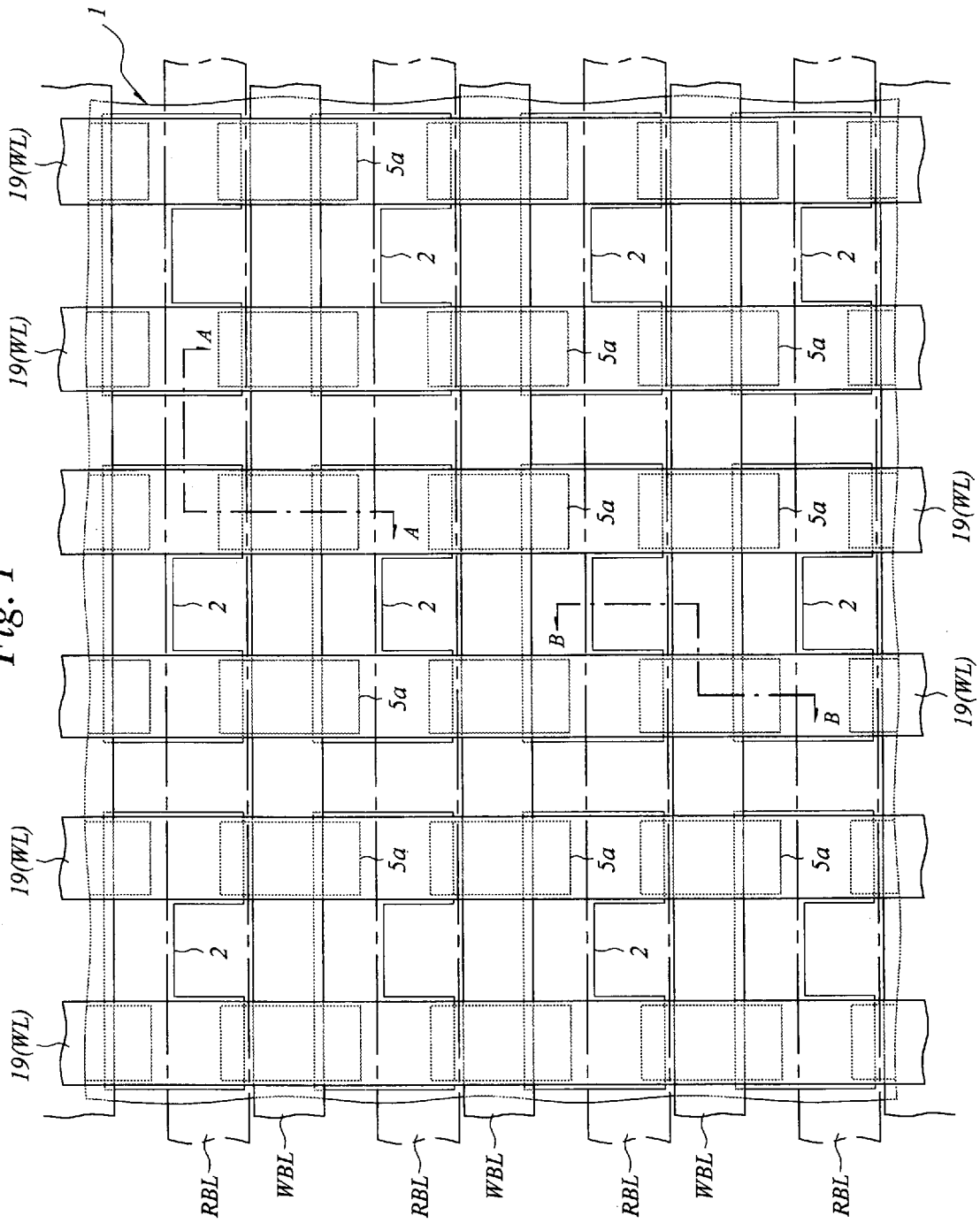
FIG. 1 is a plan view showing a memory array region of a semiconductor memory device according to an embodiment of the present invention.
Figure 2:
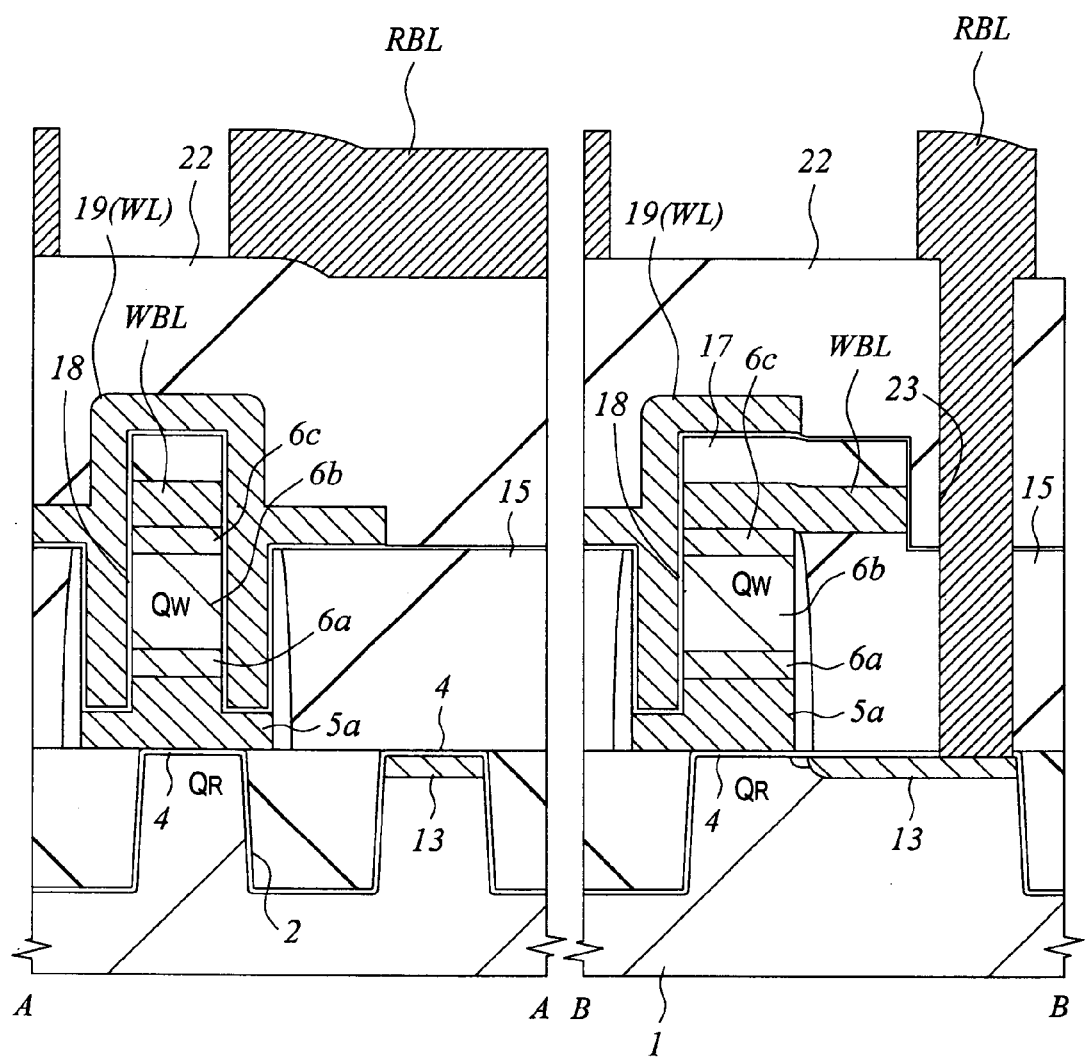
FIG. 2 is a cross-sectional view taken along the line A—A and the line B—B of FIG. 1.

FIG. 1 is a plan view showing a memory cell array region of a semiconductor memory device according to an embodiment of the present invention. FIG. 2 is a cross-sectional view taken along the ling A—A and the line B—B of FIG. 1. FIG. 3 is an equivalent circuit diagram showing two memory cells adjacent to each other in this semiconductor memory device.

The semiconductor memory device according to the embodiment includes a memory array region and a peripheral circuit region to be described later, the memory array region being constituted of a plurality of memory cells arranged in matrix on a main surface of a semiconductor substrate 1 (hereinafter, referred to as a substrate) made of single crystal silicon. Each of a plurality of memory cells is constituted of one reading MIS transistor $Q_R$ and one writing MIS transistor $Q_W$.

The reading MIS transistor $Q_R$ is constituted of, for example, an n channel type MIS transistor. The reading MIS transistor $Q_R$ has a pair of $n^+$ type semiconductor regions (source region and drain region) 13 and 13 and a first gate electrode 5a formed on a path of these $n^+$ type semiconductor regions (source region and drain region) 13 and 13 via a first gate insulating film 4. The first gate insulating film 4 is constituted of, for example, a silicon oxide film, and the first gate electrode 5a is constituted of, for example, n type polycrystalline silicon film.

On the main surface of the substrate 1 of the memory array region, element isolation trenches 2, which have a U-shaped or concave-shaped flat surface (refer to FIG. 6) and form an island structure, are formed along a row direction (horizontal direction of FIG. 1) and a column direction (vertical direction of FIG. 1) at a predetermined interval therebetween.

As shown in the cross-sectional view of FIG. 2 taken along the line A—A, the first gate electrode 5a of the reading MIS transistor $Q_R$ has a convex shape in the cross section in the column direction, that is, a convex portion is formed at the central portion of the first gate electrode 5a. Also, one of the end portions in the column direction of this first gate electrode 5a terminates on the element isolation trench 2, and the other thereof terminates on another element isolation trench 2 adjacent to that element isolation trench 2.

The writing MIS transistor $Q_W$ is arranged above the reading MIS transistor $Q_R$. This writing MIS transistor $Q_W$ is constituted of, for example, an n channel type MIS transistor. The writing MIS transistor $Q_W$ has a vertical structure in which a second gate electrode 19 is arranged on both sides (both sides in the column direction) of a layered structure extending in the vertical direction of the main surface of the substrate 1 via a second gate insulating film 18. The second gate insulating film 18 is constituted of, for example, a silicon oxide film. The second gate electrode 19 is constituted of, for example, an n type polycrystalline silicon film. The second gate electrode 19 constitutes a word line WL, and the second gate electrodes 19 form a stripe-shaped flat pattern in which the second gate electrodes 19 extends in the column direction of the memory array region as shown in FIG. 1.

The layered structure constituting a part of the writing MIS transistor $Q_W$ is made of a polycrystalline silicon film patterned to form a quadratic-prism shape and has a structure in which a lower semiconductor layer 6a constituting a source region (Although it functions also as a drain region depending on the operation condition, generically defined as a source region.), an intermediate semiconductor layer 6b constituting a channel forming region, and an upper semiconductor layer 6c constituting a drain region (Although it functions also as a source region depending on the operation condition, generically defined as a drain region.) are laminated in this order. The lower semiconductor layer (source region) 6a arranged on and electrically connected to the first gate electrode 5a of the reading MIS transistor $Q_R$ and the upper semiconductor layer (drain region) 6c as the uppermost layer are made of, for example, a low resistive polycrystalline silicon film in which phosphorus at a concentration of about $1\times10^{20}/cm^{-3}$ is introduced. Also, the intermediate semiconductor layer 6b constituting the channel forming region is made of a high resistive polycrystalline silicon film in which phosphorus of extremely low concentration (for example, about $1\times10^{15}/cm^{-3}$ to $1\times10^{17}/cm^{-3}$) is introduced. The intermediate semiconductor layer 6b substantially constitutes the substrate of the writing MIS transistor $Q_W$.

A writing bit line (first bit line) WBL electrically connected to the upper semiconductor layer 6c is formed on the upper semiconductor layer 6c constituting the drain region of the writing MIS transistor $Q_W$. The writing bit line WBL is constituted of, for example, an n type polycrystalline silicon film, and the writing bit lines WBL form a stripe-shaped flat pattern, in which the writing bit lines WBL extend in the row direction of the memory array region as shown in FIG. 1.

The length of the writing bit line WBL in the column direction (i.e., a width of the writing bit line WBL) is equal to that of the layered structure (upper semiconductor layer 6c, intermediate semiconductor layer 6b, and lower semiconductor layer 6a) in the column direction and is smaller than that of the first gate electrode 5a in the column direction. As described later, the writing bit line WBL and the layered structure located below the writing bit line WBL are successively formed in one etching process. Also, in this etching process, following the etching of the layered structure, a part of the first gate electrode 5a located below the layered structure is etched. Therefore, the first gate electrode 5a is made to have a convex-shaped cross section (cross-sectional shape in the column direction). Specifically, since the patterning of the layered structure is performed on the first gate electrode 5a, the first gate electrode 5a can function as an etching stopper in the etching process of the layered structure.

Reading bit lines RBL (second bit line) are formed in parallel to each other above the writing bit line WBL. The reading bit line RBL is electrically connected to the drain region ($n^+$ type semiconductor region 13) of the reading MIS transistor $Q_R$ through a contact hole 23 formed through insulating films (second interlayer insulating film 22 and first interlayer insulating film 15), each formed below the reading bit line RBL. The reading bit line RBL is constituted of, for example, a metal film such as aluminum (Al) alloy, and the reading bit lines RBL form a stripe-shaped flat pattern in which the reading bit lines RBL extend in the column direction of the memory array region as shown in FIG. 1. The reason why the writing bit line WBL and the reading bit line RBL can extend parallelly to each other is that the element isolation region 2 is formed so as to have the U-shape or the convex shape as described above.

FIG. 3 is an equivalent circuit diagram showing two memory cells adjacent to each other in the semiconductor memory device having the above-described structure. A capacitor C is a capacitor formed between the writing MIS transistor $Q_W$ and the reading MIS transistor $Q_R$. According to the structure of the present invention, since the reading bit line RBL is separate from the writing bit line WBL and provided independently, a stable, high-speed operation can be achieved.

An operation example of the equivalent circuit will be described with reference to the circuit diagram of FIG. 3. A word voltage pulse VWL of three-value level is applied to a word line WL. Namely, a negative voltage −VS (e.g., −2 V) is applied thereto in the storage operation (non-selected state); a voltage VR (e.g., 0.5 V) in the reading operation; and a voltage VW (e.g., 3 V) in the writing operation, respectively. The reading operation is carried out while the writing transistor $Q_W$ is set in the OFF state (non-conductive state). Accordingly, the reading voltage VR is selected so as to have a voltage value smaller than that of a threshold voltage VTW (threshold voltage set with using a source voltage of $Q_w$ as a reference) of the writing MIS transistor $Q_W$. Also, the writing voltage VW is selected so as to be larger than that obtained by adding a voltage VBL of the writing bit line and a threshold voltage VTW (VBL+VTW) so as to turn on the writing MIS transistor $Q_W$. By so setting, it becomes possible to turn on the writing transistor $Q_W$ independently of a writing voltage (VDD, 0) corresponding to a two-value signal (1, 0) of the voltage VBL of the writing bit line. A negative voltage is applied as a holding voltage VS. Coupling capacitors C function to shift the voltage VBL (VDD, 0) written in a node N (5a) to a negative side when the writing operation is finished and the word voltage is changed from VW to −VS, thereby transferring to anon-selected state (holding state). In the writing of the data, the voltage VW (e. g., 3 V) is applied to the word line WL, and the writing MIS transistor $Q_W$ is turned on. Accordingly, a voltage of 1.5 V or 0 V corresponding to the logic "1" or "0" of the writing bit line WBL is written and stored in the first gate electrode (5a) of the reading MIS transistor $Q_R$. In a data holding state, a voltage Vs (e. g., −2 V) is applied to the word line WL. Whereby, the writing MIS transistor $Q_W$ is turned off and the first gate electrode of the reading MIS transistor $Q_R$ is electrically floated or shut out from other circuit systems, and then stored data, which is previously written, is memorized and held. At this time, due to the application of the negative holding voltage, a voltage of the node N (5a) is shifted to −0.7 V in the case of the logic "1", and to −2 V in the case of the logic "0". In the data reading state, a voltage VR (e. g., 0.5 V) is applied to the word lineWL. This voltage turns off the writing MIS transistor $Q_w$. Also, if the stored voltage VN of the first gate electrode 5a (node N) of the reading MIS transistor is a high voltage (logic 1), a voltage (e.g., 0.5 V) higher than the threshold voltage VTR (e.g., −0.2 V) of the reading voltage VR is applied to the gate electrode 5a of the reading MIS transistor $Q_R$. If the stored voltage VN is a low voltage (logic 0), a voltage (e.g., −0.7 V) lower than the threshold voltage VTR (e.g., −0.2 V) of the reading voltage VR is applied to the gate electrode 5a of the reading MIS transistor $Q_R$. Consequently, a voltage of 0 V is applied to the reading bit line RBL (ON state) or a high voltage VD of 1.5 V is applied thereto (OFF state) according to the data "1" or "0".

Figure 4:
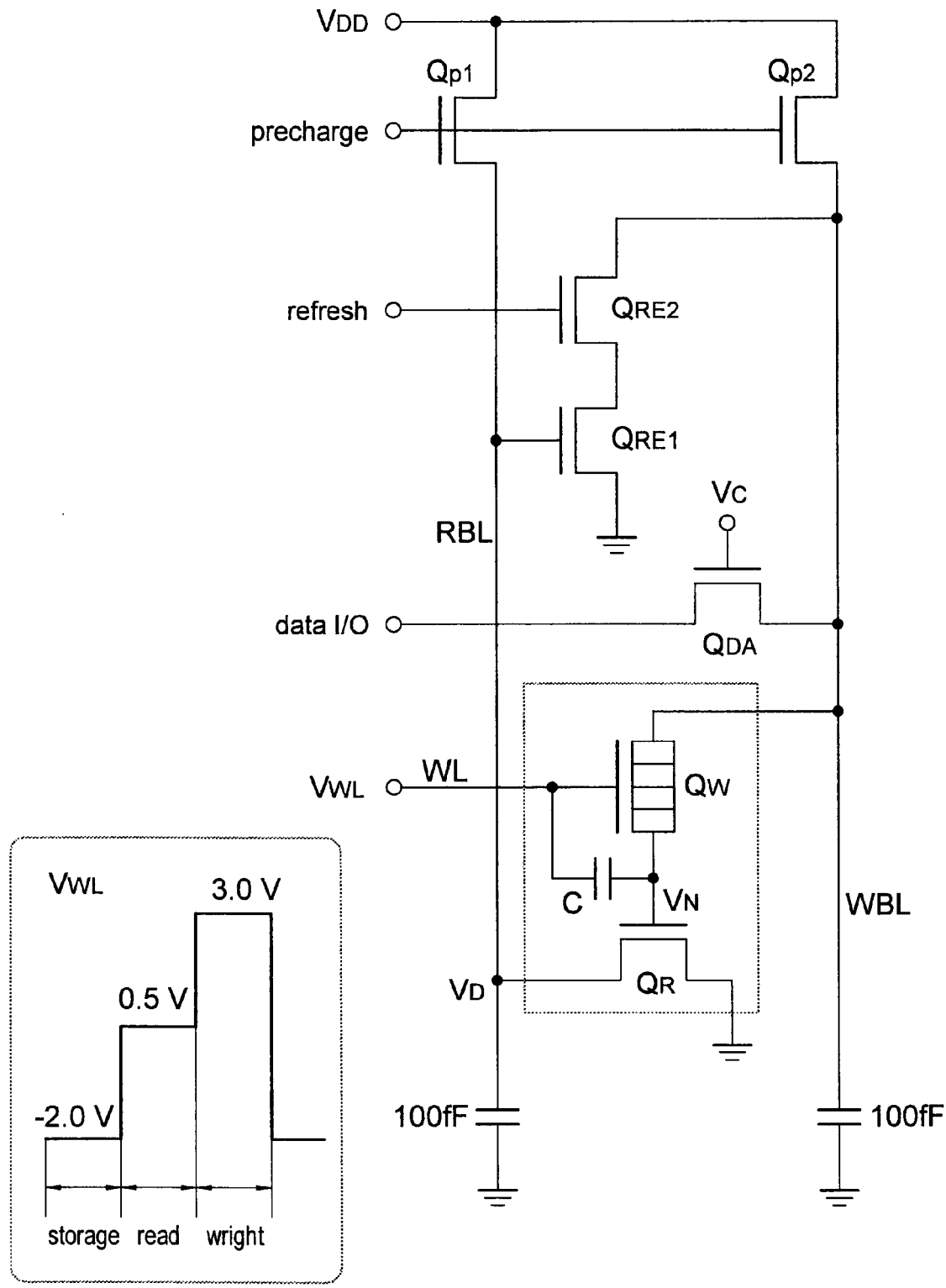
FIG. 4 is an explanatory diagram of a writing/reading operation of the memory cell of the semiconductor memory device according to the embodiment of the present invention.
Figure 5:
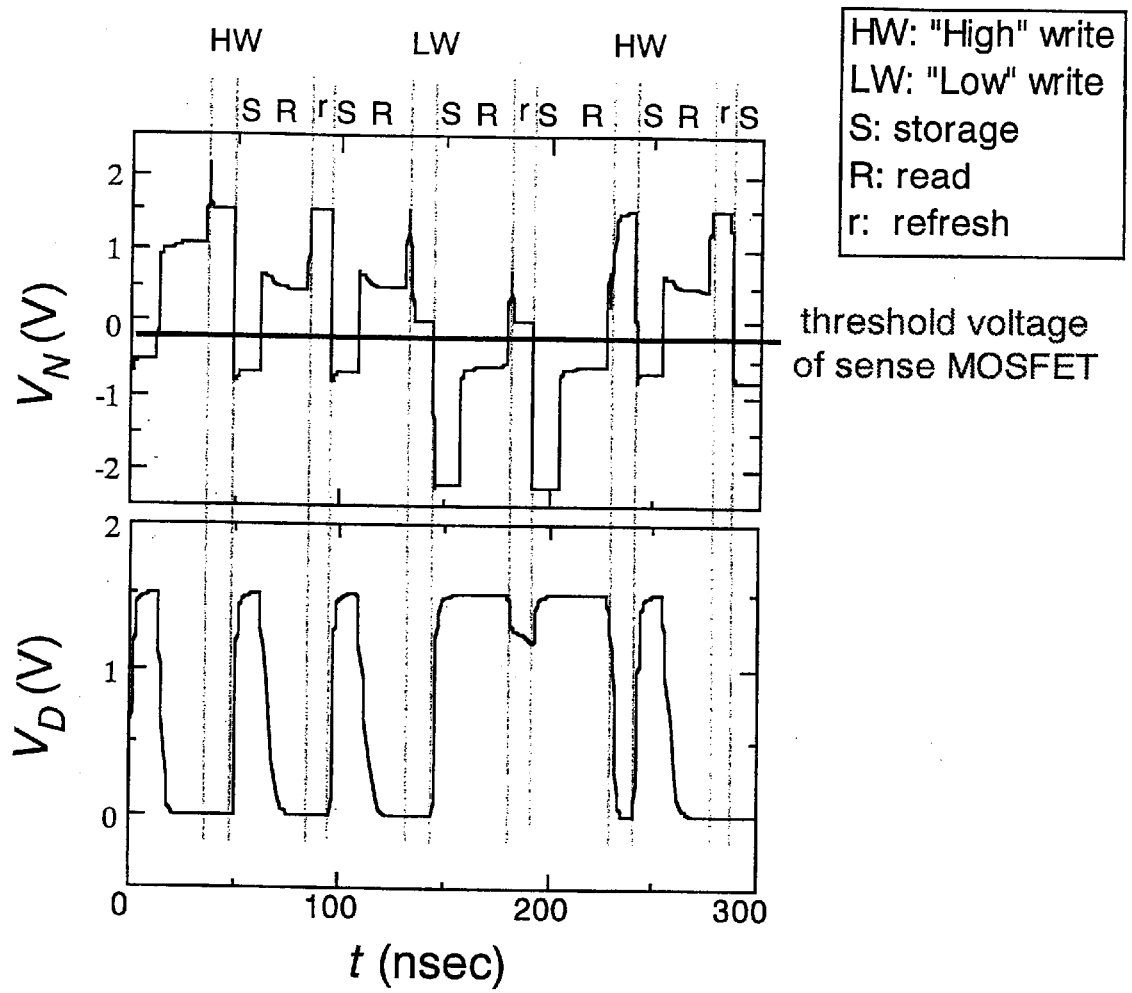
FIG. 5 is an explanatory diagram of a writing/reading operation of the memory cell of the semiconductor memory device according to the embodiment of the present invention.

FIGS. 4 and 5 show a principle circuit diagram and an operating waveform graph with respect to one bit cell, respectively. In FIG. 4, reference symbols QP1 and QP2 denote MISFETs constituting a precharge circuit, QRE1 and QRE2 denote MISFETs constituting a refresh circuit, and QDA denotes a MISFET for controlling data input/output. The reference symbol 100fF denotes a straight capacitor.

According to the semiconductor memory device of the present invention, since the reading MIS transistor $Q_W$ is arranged on the first gate electrode 5a, a pn junction of semiconductor bulk is not connected to the storage node (5a). Therefore, in the state where the writing MIS transistor $Q_W$ is in the OFF state (cutoff state), the storage node is not influenced by a leak current caused by the pn junction in the semiconductor bulk due to the influence of alpha rays or the like. In addition, electrical leakage paths other than the source-drain path of the writing MIS transistor $Q_w$ can be removed. By doing so, the stored data holding characteristic can be improved without using any high-capacity capacitor.

The semiconductor memory device according to this embodiment has a memory cell structure in which the writing MIS transistor $Q_W$ having a vertical structure is arranged on the reading MIS transistor $Q_R$. Therefore, the memory cell, which is easily made fine, can be realized. For example, in a layout as shown in FIG. 1, assuming that the minimum process dimension is set as F, the process dimension per one bit in the extending direction of the writing bit line WBL and the reading bit line RBL, is set as 2F, and the process dimension per one bit across these bit lines WBL and RBL is set as 2.5F, an occupation area of the memory cell can be set as 2F×2.5F.

Next, the method of manufacturing the semiconductor memory device will be described by the use of FIGS. 6 to 24 in accordance with fabrication steps. Among these drawings, cross-sectional views added by the reference symbol A—A are cross-sectional views taken along the line A—A of FIG. 1, and cross-sectional views added by the reference symbol B—B are cross-sectional views taken along the line B—B of FIG. 1. Other cross-sectional views are cross-sectional views showing a peripheral circuit region. Also, plan views show only a memory array region.

Figure 6:
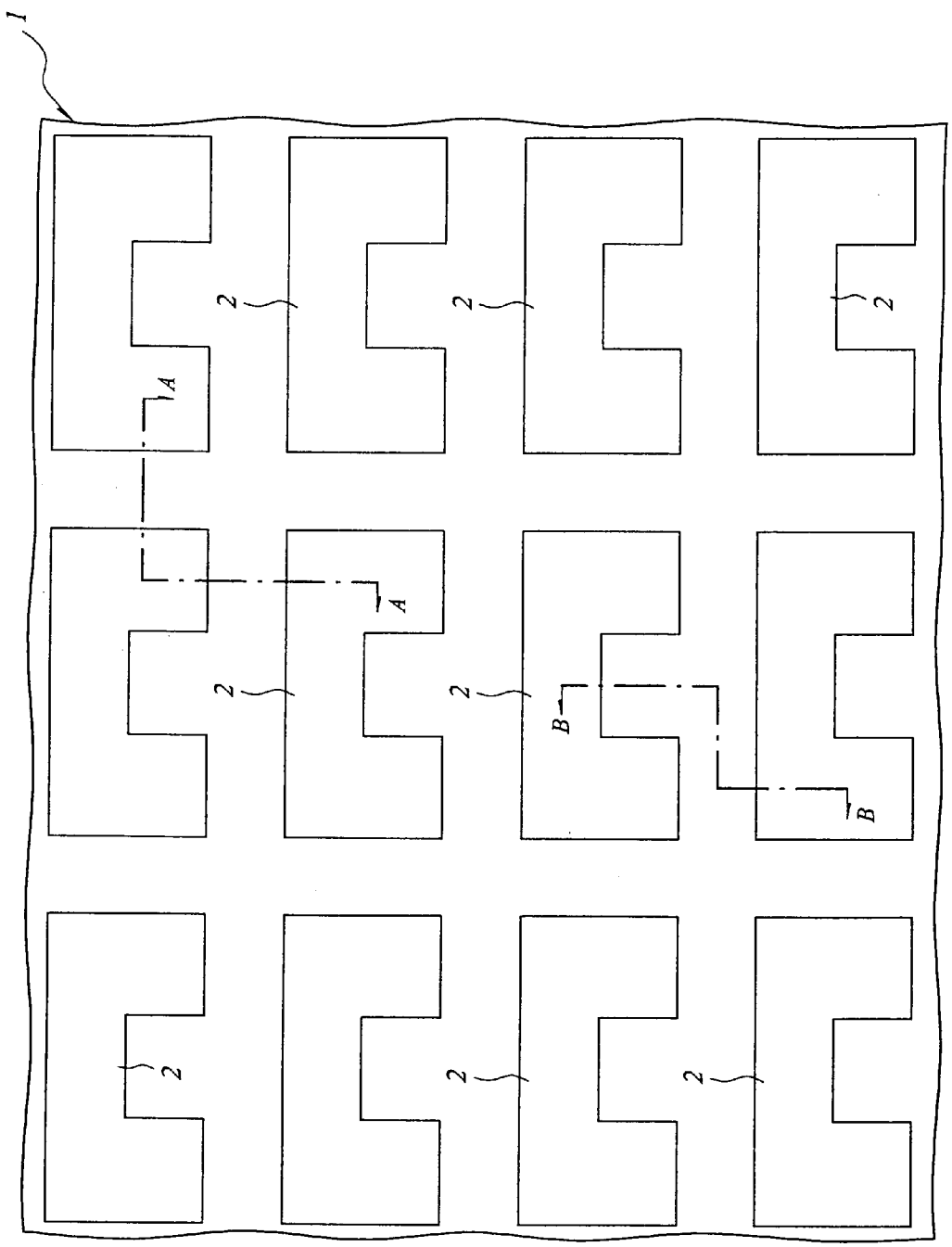
FIG. 6 is a plan view showing a method of manufacturing the semiconductor memory device according to the embodiment of the present invention.
Figure 7:
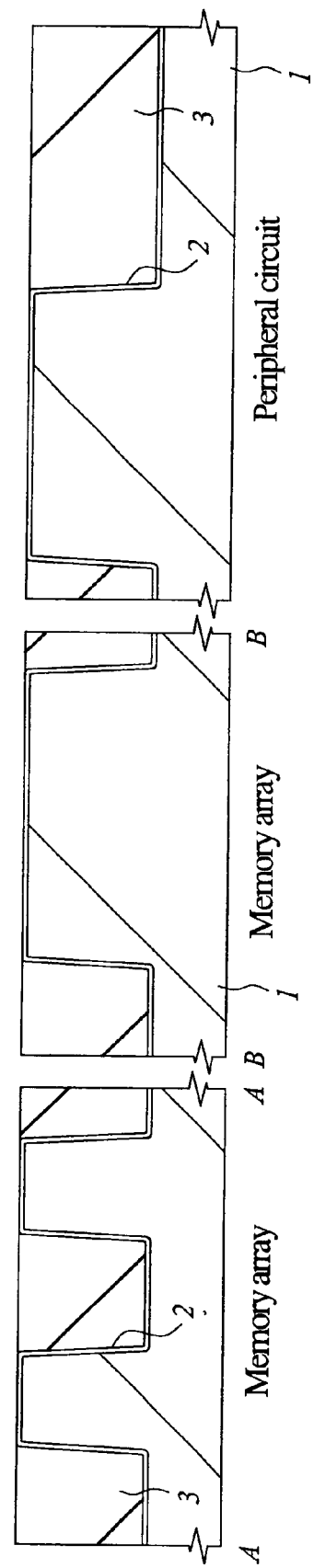
FIG. 7 is a plan view showing a method of manufacturing the semiconductor memory device according to the embodiment of the present invention.

Firstly, as shown in FIGS. 6 and 7, a plurality of element isolation trenches 2 are formed on the element isolation region of the main surface of the substrate 1. The element isolation trench 2 is formed according to the steps as follows: a trench is formed by etching the main surface of the substrate 1; a silicon oxide film 3 is deposited by the CVD method on the substrate 1 including the inside of this trench; and the unnecessary silicon oxide film 3 outside this trench is polished and removed by the Chemical Mechanical Polishing (CMP) method. As shown in FIG. 6, the element isolation trench 2 of the memory array region has the U-shaped or convex-shaped flat surface, and the element isolation trenches 2 are arranged along the row direction and the column direction at a predetermined interval there between. Also, the formation of these element isolation trenches 2 forms an active region whose boundary is defined by these element isolation trenches 2.

Figure 8:
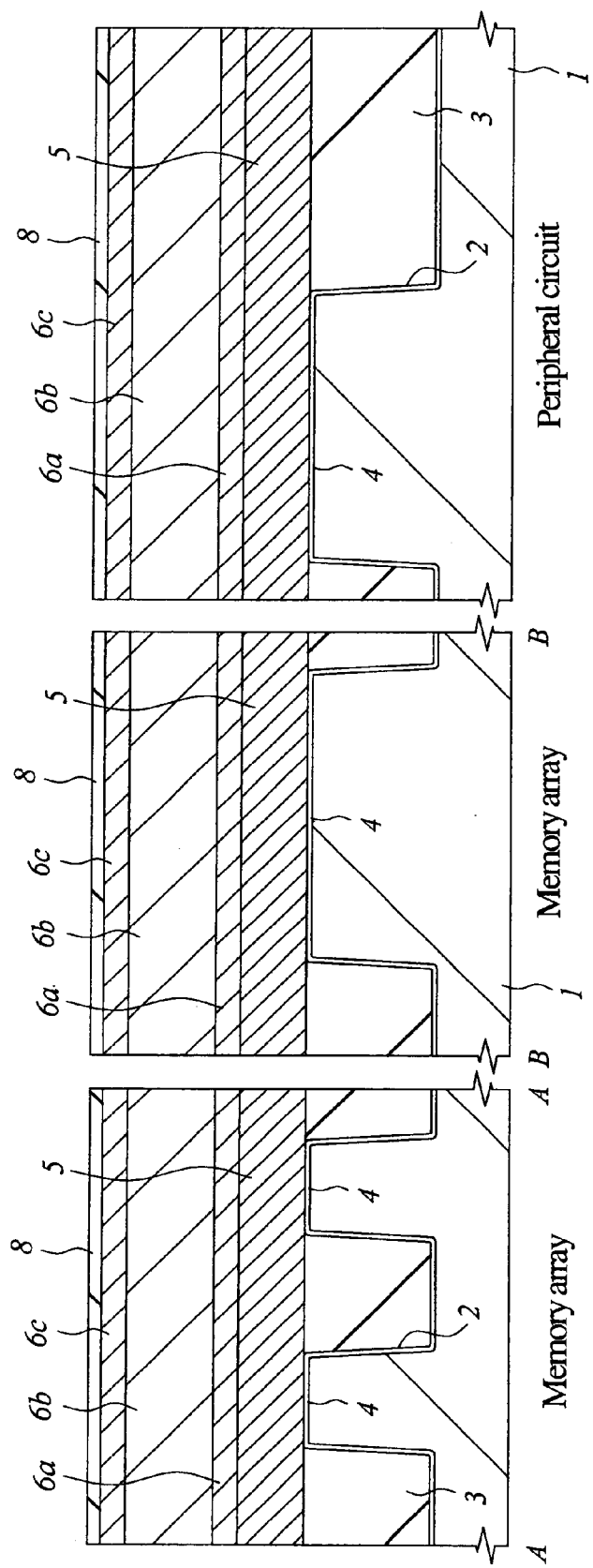
FIG. 8 is a plan view showing a method of manufacturing the semiconductor memory device according to the embodiment of the present invention.

Next, as shown in FIG. 8, the substrate 1 is subjected to the wet oxidation to form a first gate insulating film 4 made of a silicon oxide film on the surface of the substrate 1. Thereafter, a polycrystalline silicon film 5 is formed above the substrate 1 by the CVD method. Phosphorus is introduced in the polycrystalline silicon film 5 during the deposition thereof to have an n conductive type. Subsequently, a polycrystalline silicon film is deposited by the CVD method on the polycrystalline silicon film 5 to form the lower semiconductor layer 6a, the intermediate semiconductor layer 6b, and the upper semiconductor layer 6c. Then, a silicon nitride film 8 is deposited by the CVD method on the upper semiconductor layer 6c. Phosphorus of about $1\times10^{20}/cm^{-3}$ is introduced into the polycrystalline silicon films constituting the lower semiconductor layer 6a and the upper polycrystalline semiconductor layer 6c, and phosphorus of about $1\times10^{15}/cm^{-3}$ to $1\times10^{17}/cm^{-3}$ is introduced into the polycrystalline silicon film constituting the intermediate semiconductor layer 6b. The concentration of phosphorus in the polycrystalline silicon film is controlled by changing the concentration of the phosphorus-containing gas ($PH_3$) during the deposition of the polycrystalline silicon films.

Figure 9:
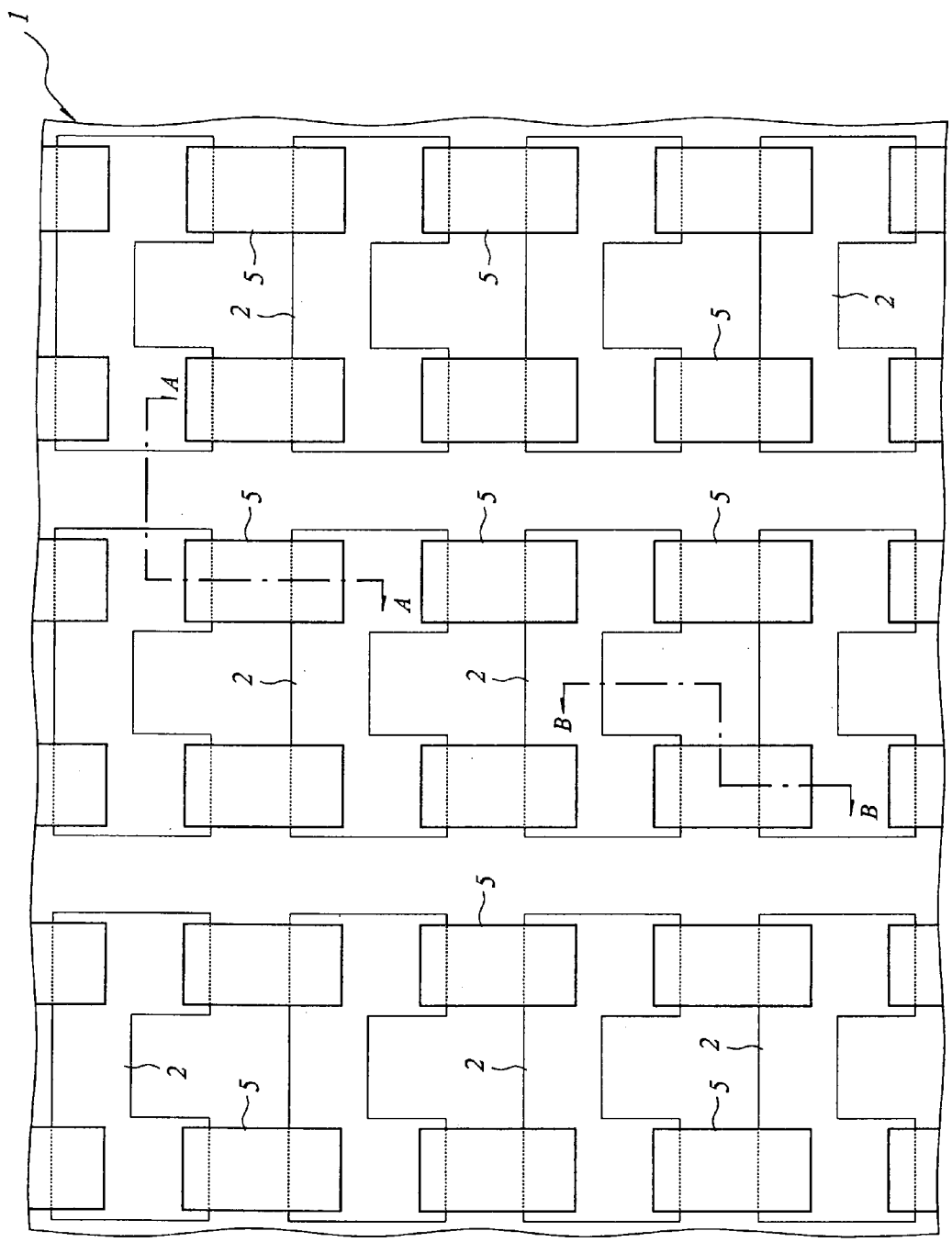
FIG. 9 is a plan view showing a method of manufacturing the semiconductor memory device according to the embodiment of the present invention.
Figure 10:
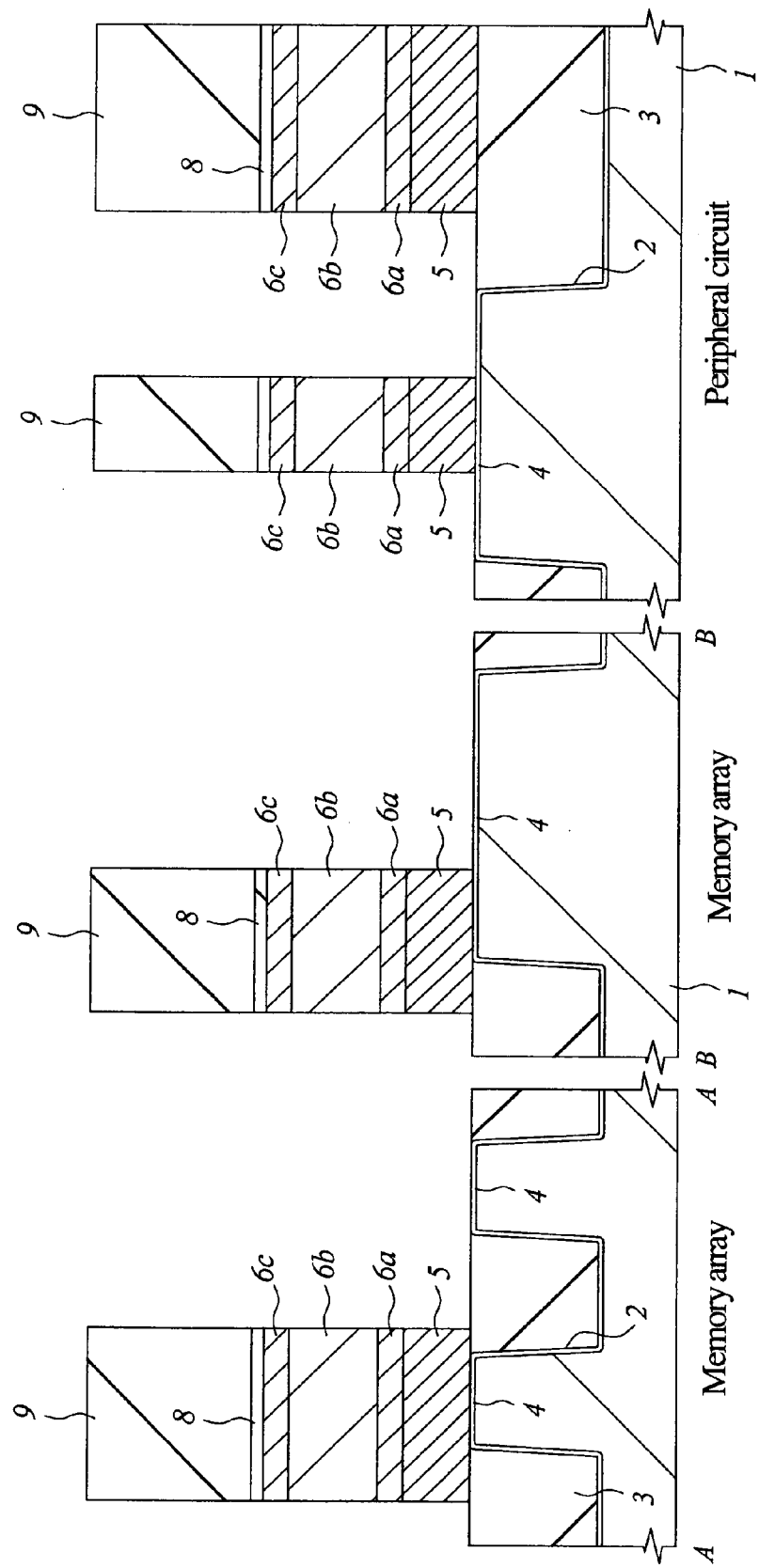
FIG. 10 is a plan view showing a method of manufacturing the semiconductor memory device according to the embodiment of the present invention.

Next, as shown in FIGS. 9 and 10, the silicon nitride film 8, the upper semiconductor layer 6c, the intermediate semiconductor layer 6b, the lower semiconductor layer 6a, and the polycrystalline silicon film 5 are patterned by dry etching using a photoresist film 9 as a mask. As shown in FIG. 9, the polycrystalline silicon film 5, the polycrystalline silicon films thereon (lower semiconductor layer 6a, intermediate semiconductor layer 6b and upper semiconductor layer 6c), and the silicon nitride film 8, which are subjected to the patterning, are arranged in matrix on the positions corresponding to each row and column of the memory cell, and each of them is made to form a rectangular flat surface having end portions in the column direction terminating on the element isolation trenches 2.

Figure 11:
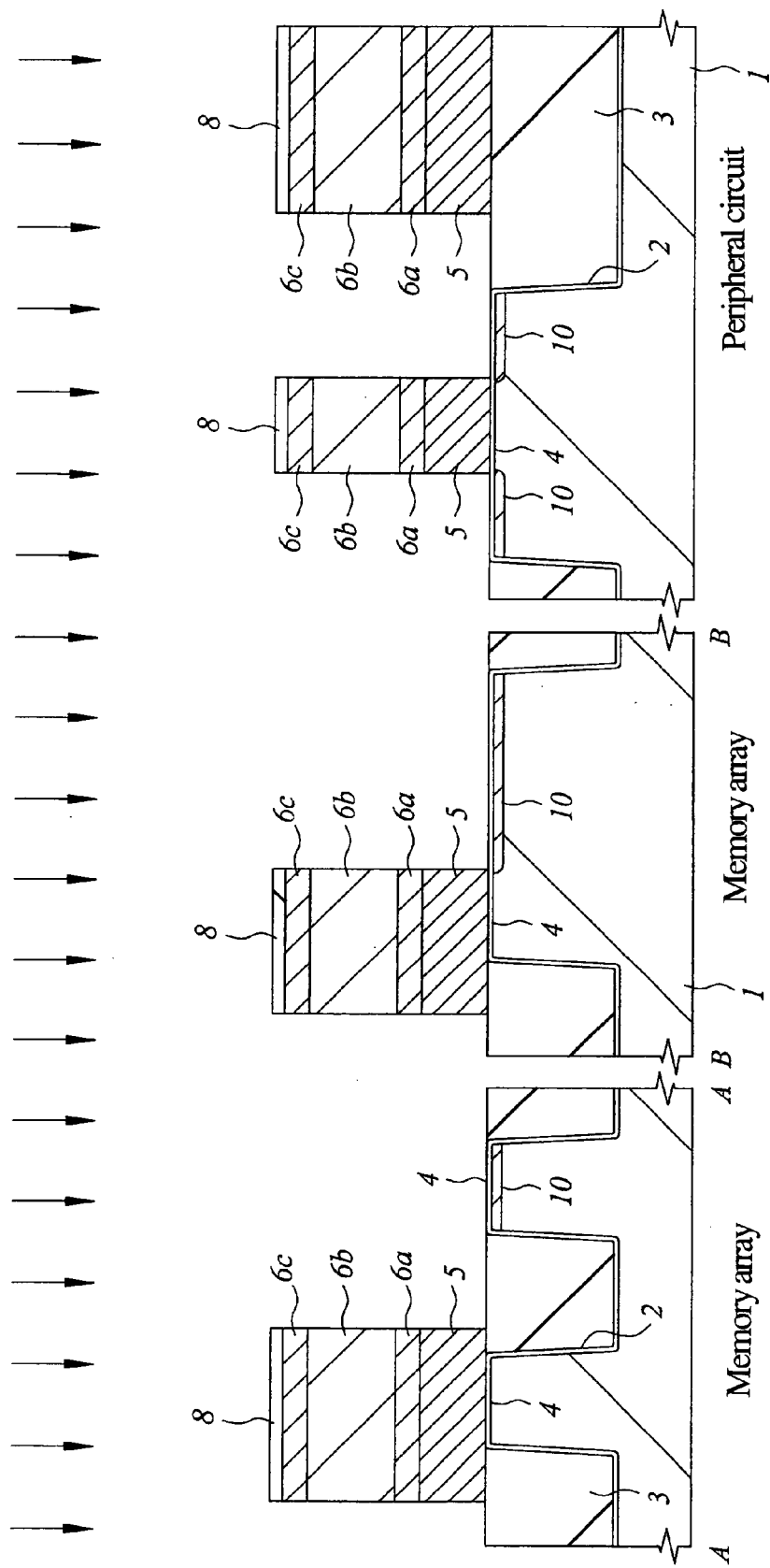
FIG. 11 is a plan view showing a method of manufacturing the semiconductor memory device according to the embodiment of the present invention.

Next, after the photoresist film 9 is removed, n type impurities (phosphorus or arsenic (As)) are ion-injected into the substrate 1 of the memory array region and the peripheral circuit region, thus forming an n⁻ type semiconductor region 10 as shown in FIG. 11. The n⁻ type semiconductor region 10 is formed such that the source and drain regions of the reading MIS transistor $Q_R$ and the source and drain regions of the MIS transistor of the peripheral circuit have a Lightly Doped Drain (LDD) structure.

Figure 12:
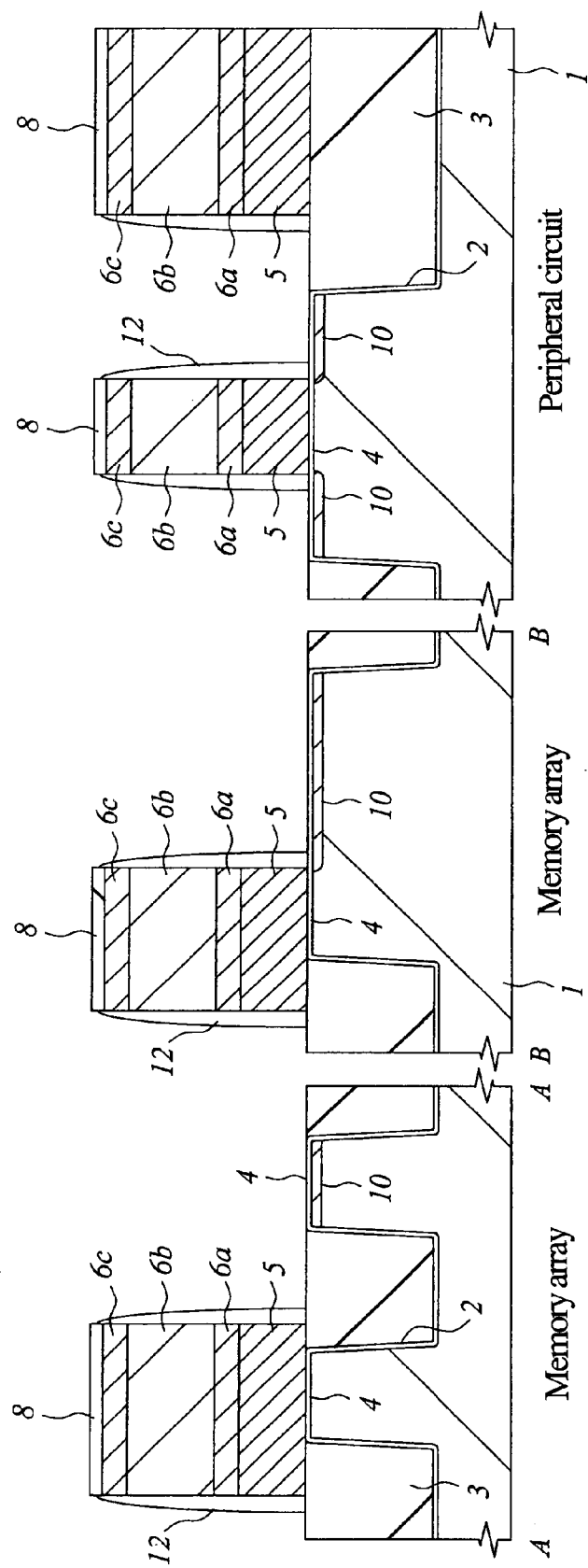
FIG. 12 is a plan view showing a method of manufacturing the semiconductor memory device according to the embodiment of the present invention.

Next, as shown in FIG. 12, a sidewall spacer 12 is formed on the sidewall of the polycrystalline silicon film 5, the layered structure made of the polycrystalline silicon films (lower semiconductor layer 6a, intermediate semiconductor layer 6b and upper semiconductor layer 6c), and the silicon nitride film 8. The sidewall spacer 12 is formed by depositing a silicon oxide film above the substrate 1 by the CVD method, and then pattering the silicon oxide film by anisotropic etching.

Figure 13:
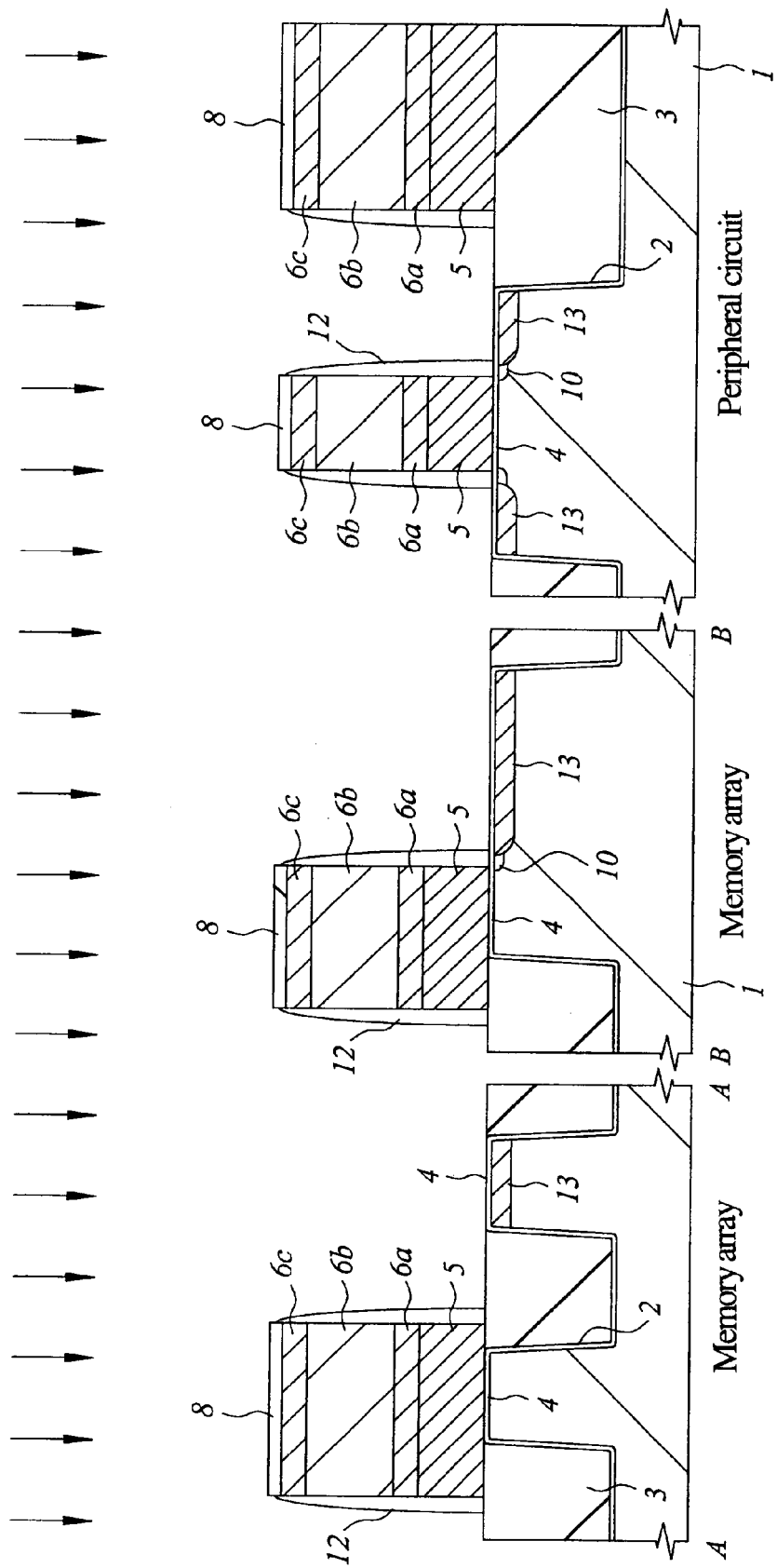
FIG. 13 is a plan view showing a method of manufacturing the semiconductor memory device according to the embodiment of the present invention.

Next, as shown in FIG. 13, the n type impurities (phosphorus or arsenic (As)) are ion-injected into the substrate 1 of the memory array region and the peripheral circuit region, thus forming an n⁺ type semiconductor region 13 constituting the source and drain regions of the reading MIS transistor $Q_R$ and forming an n⁺ type semiconductor region 13 constituting the source and drain regions of the MIS transistor of the peripheral circuit.

Figure 14:
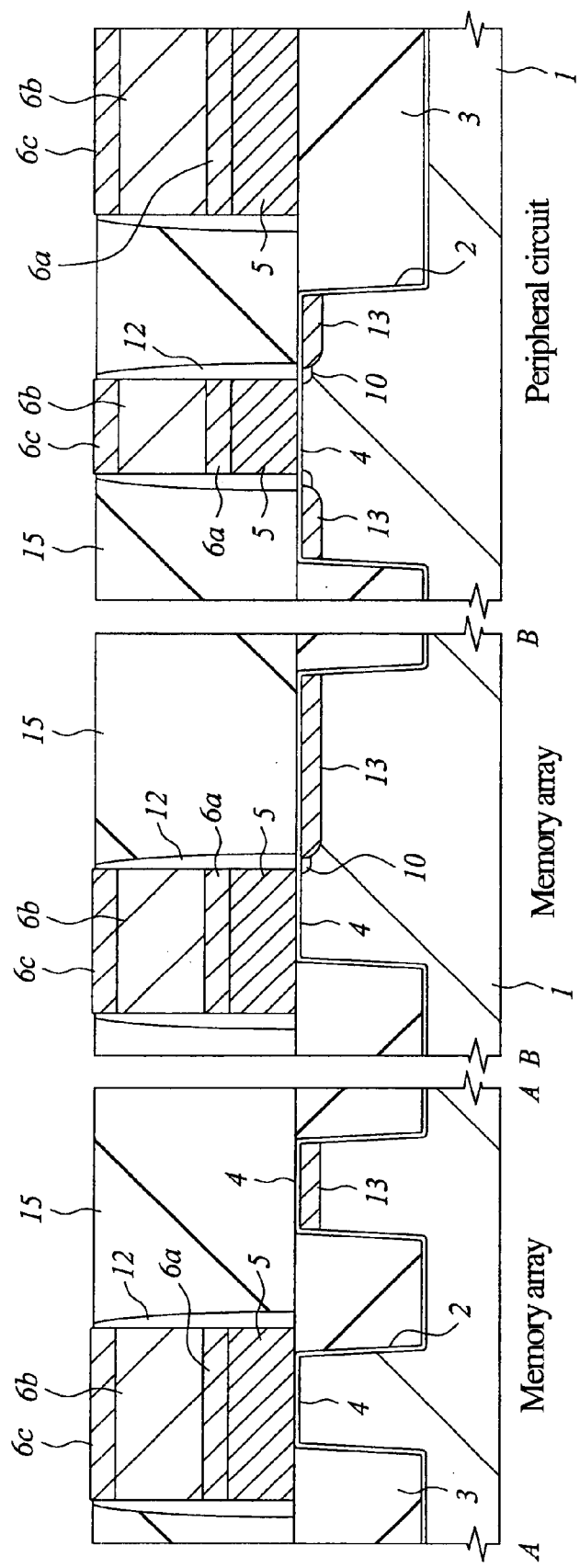
FIG. 14 is a plan view showing a method of manufacturing the semiconductor memory device according to the embodiment of the present invention.

Next, as shown in FIG. 14, a first interlayer insulating film 15 is formed above the substrate 1 of the memory array region and the peripheral circuit region. The first interlayer insulating film 15 is constituted of an insulating film having high gap fill capability, for example, a spin on glass film. The first interlayer insulating film 15 is formed according to the steps as follows: a spin on glass film is coated above the substrate 1 until the film thickness thereof reaches an extent capable of covering the silicon nitride 8; a silicon oxide film (not shown) is deposited on this spin on glass film by the CVD method; and the silicon oxide film, the spin on glass film, and the silicon nitride film 8 are polished and removed by the chemical mechanical polishing, thus exposing the surface of the upper semiconductor layer (drain region) 6c as the uppermost layer of the layered structure. According to the steps described above, the first interlayer insulating film 15 having a flat surface and a height approximately equal to that of the surface of the upper semiconductor layer (drain region) 6c is formed.

Figure 15:
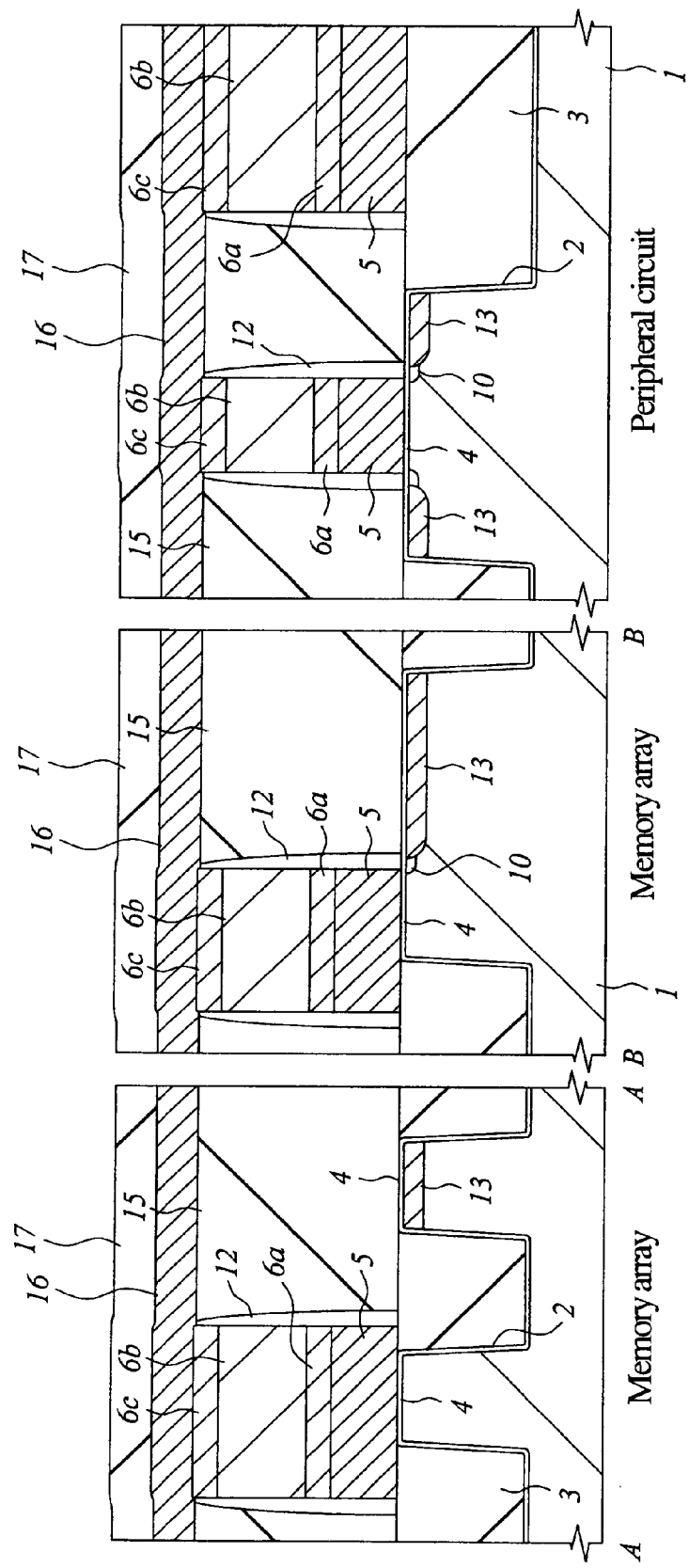
FIG. 15 is a plan view showing a method of manufacturing the semiconductor memory device according to the embodiment of the present invention.

Next, as shown in FIG. 15, a polycrystalline silicon film 16 is deposited on the upper semiconductor layer (drain region) 6c and the first interlayer insulating film 15 by the CVD method. Subsequently, a silicon oxide film 17 is deposited on the polycrystalline silicon film 16 by the CVD method. Phosphorus is introduced into the polycrystalline silicon film 16 during the deposition thereof to have an n conductive type.

Figure 16:
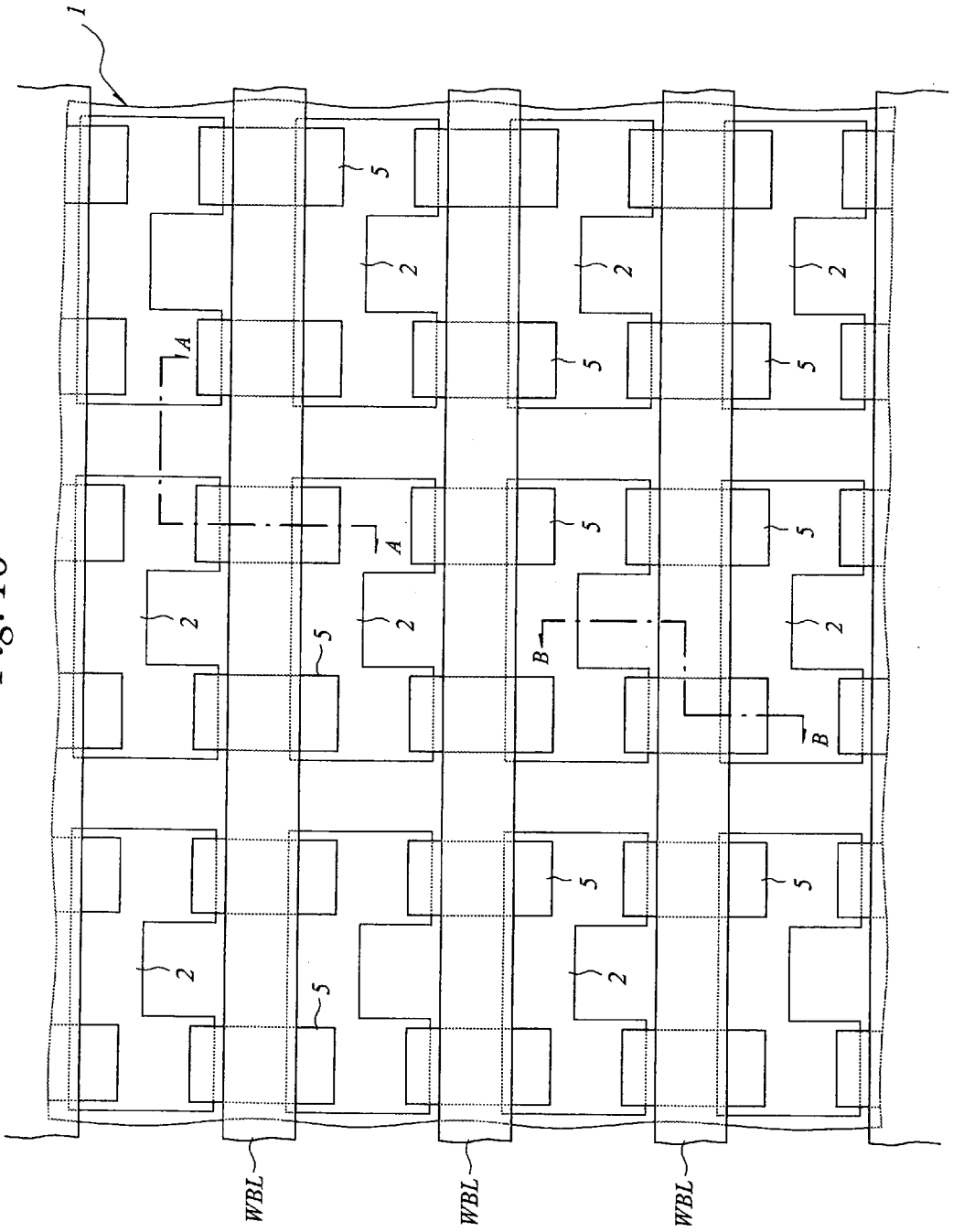
FIG. 16 is a plan view showing a method of manufacturing the semiconductor memory device according to the embodiment of the present invention.
Figure 17:
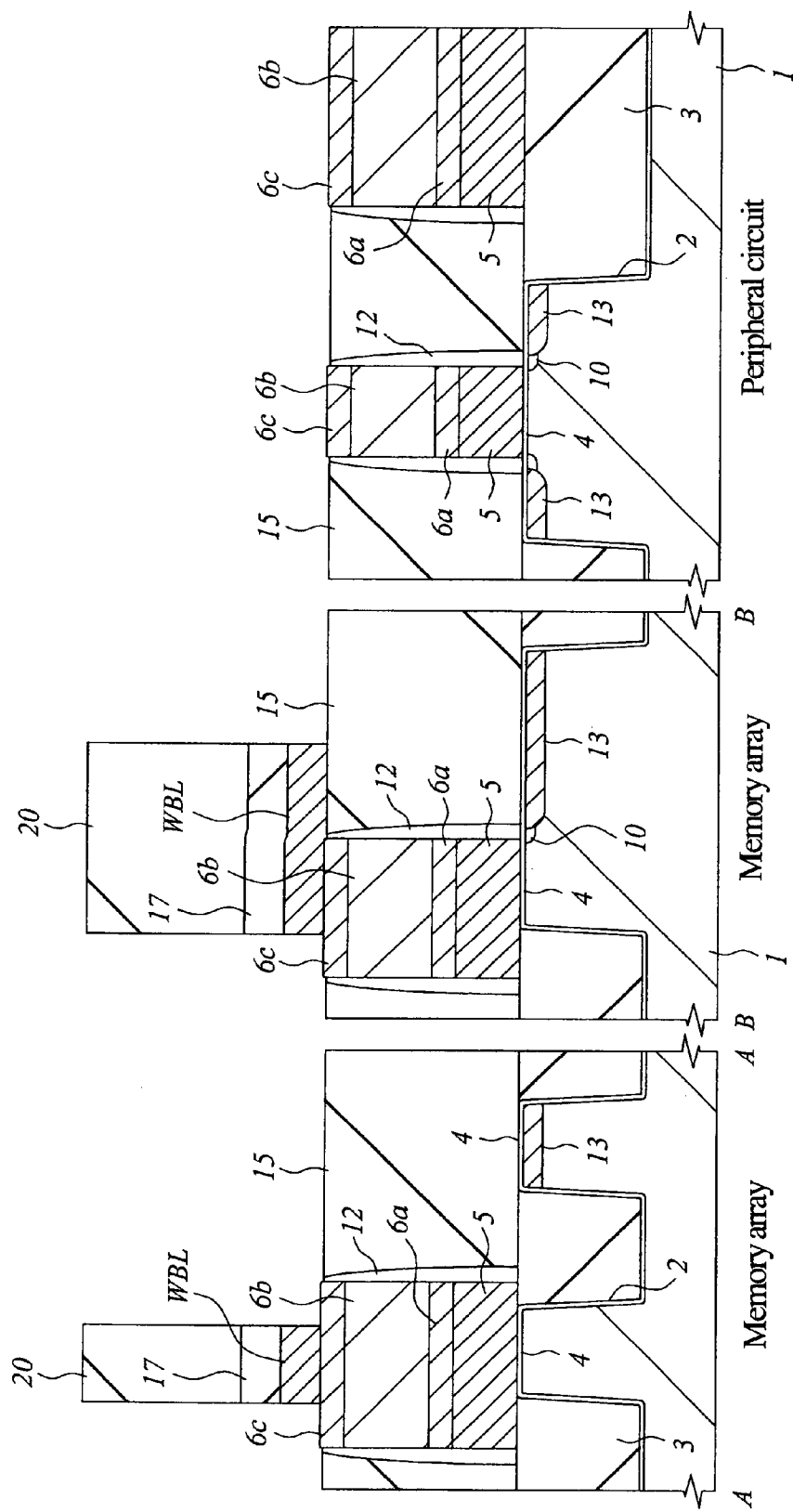
FIG. 17 is a plan view showing a method of manufacturing the semiconductor memory device according to the embodiment of the present invention.

Next, as shown in FIGS. 16 and 17, the silicon oxide film 17 and the polycrystalline silicon film 16 are patterned by dry etching using a photoresist film 20 as a mask, thus forming the writing bit line WBL electrically connected to the upper semiconductor layer (drain region) 6c. The writing bit lines WBL form a stripe-shaped flat pattern in which the writing bit lines WBL extend in the row direction of the memory array region.

Figure 18:
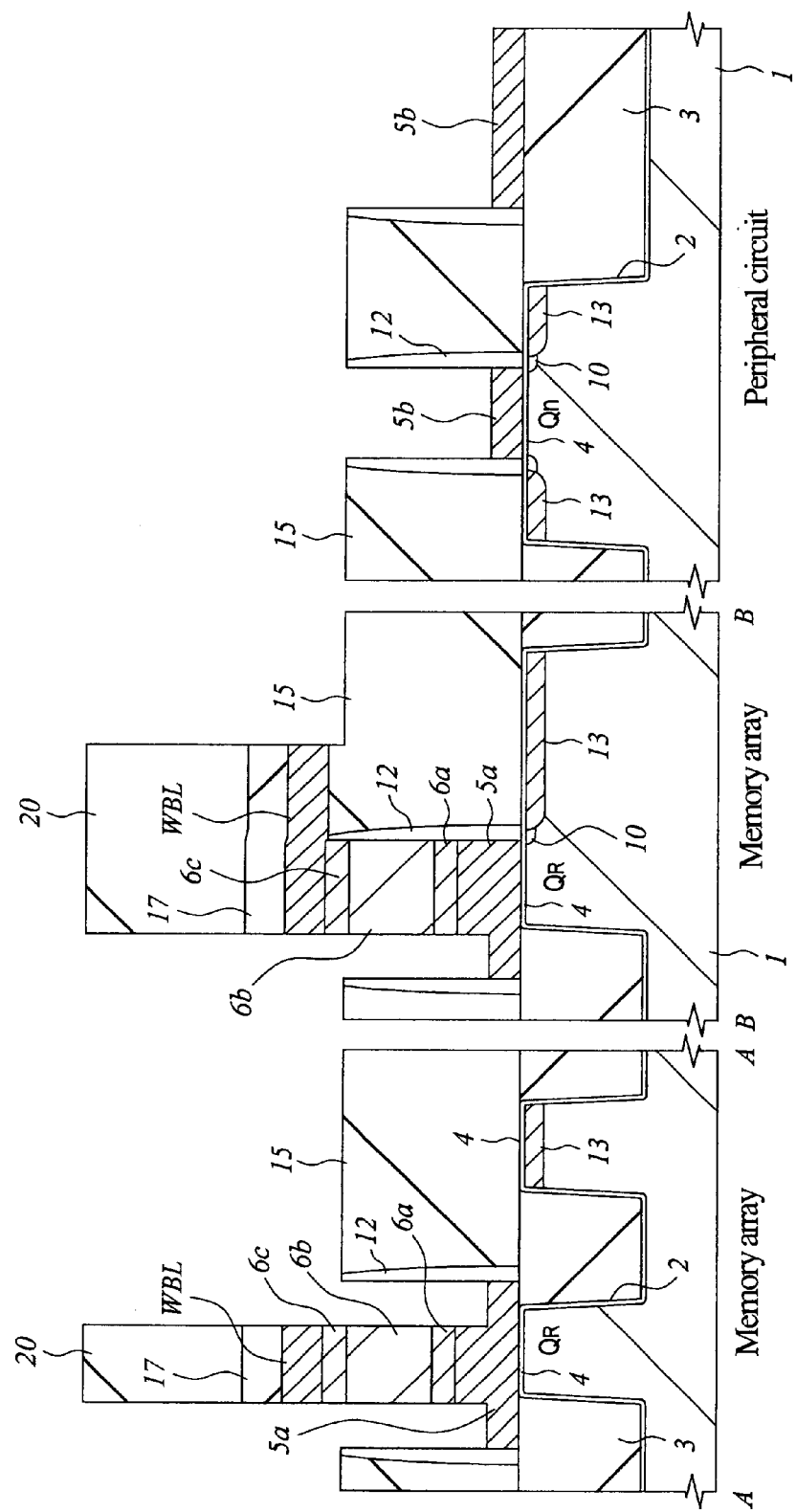
FIG. 18 is a plan view showing a method of manufacturing the semiconductor memory device according to the embodiment of the present invention.

Next, as shown in FIG. 18, the layered structure (lower semiconductor layer 6a, intermediate semiconductor layer 6b and upper semiconductor layer 6c) made of the polycrystalline silicon film below the writing bit line WBL is dry-etched using the photoresist film 20 as a mask, and further, the polycrystalline silicon film 5 below the layered structure is etched to approximately half the thickness thereof.

By the dry etching described above, the layered structure made of the lower semiconductor layer 6a constituting the source region of the writing MIS transistor $Q_W$, the intermediate semiconductor layer 6b constituting the channel forming region thereof, and the upper semiconductor layer 6c constituting the drain region thereof are patterned to form a quadratic-prism shape. In addition, the polycrystalline silicon film 5 below the layered structure is etched to approximately half the thickness of thereof. Therefore, the first gate electrode 5a having a convex-shaped cross section in the column direction is formed. Consequently, the reading MIS transistor $Q_R$ is almost completed. In the patterning process of the layered structure, since the patterning of the layered structure is performed on the first gate electrode 5a, the first gate electrode 5a can function as an etching stopper in the etching process of the layered structure. Also, since the first gate electrode 5a is etched so as to have the convex-shaped cross section, formation of a second gate insulating film 18 and a second gate electrode 19 described later is facilitated. At the same time, a gate electrode 5b is formed in the peripheral circuit region. Consequently, the n channel type MIS transistor $Q_n$ is almost completed.

Figure 19:
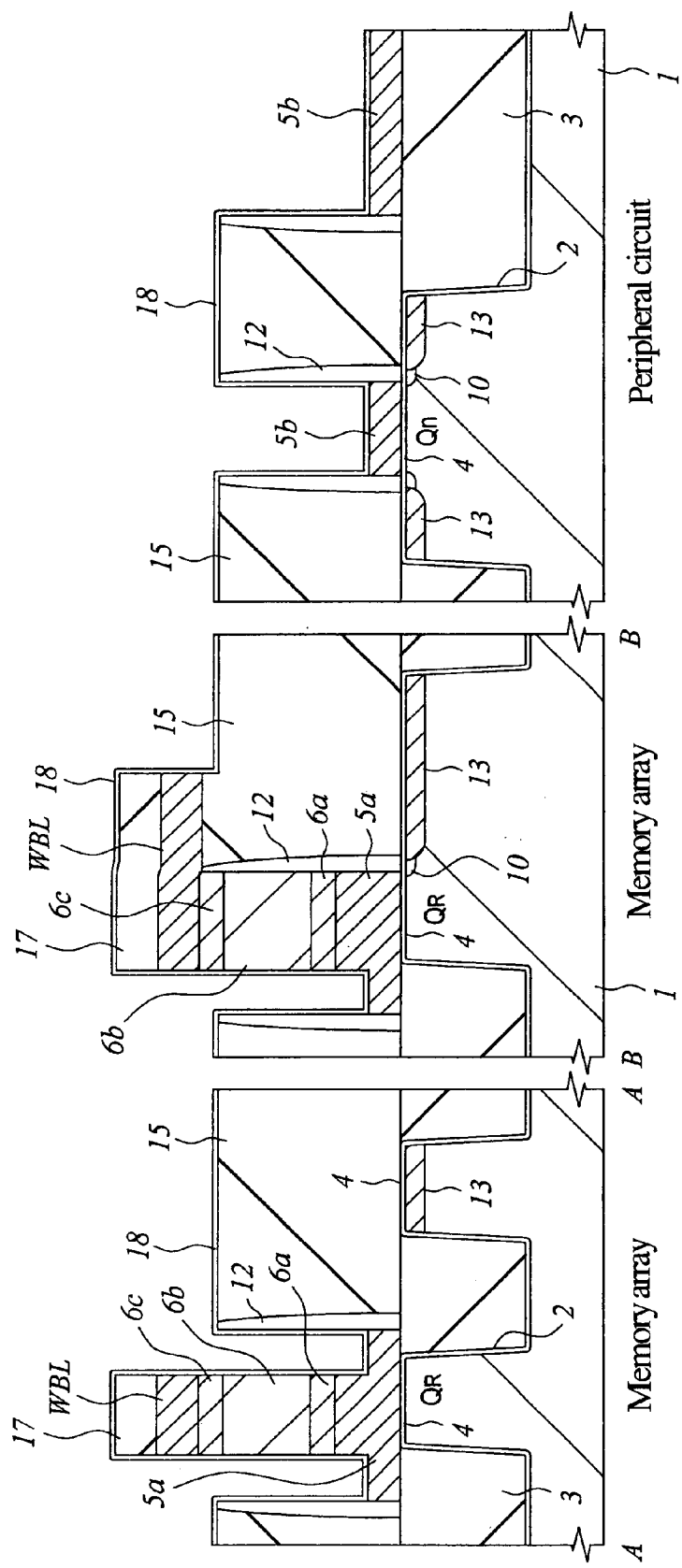
FIG. 19 is a plan view showing a method of manufacturing the semiconductor memory device according to the embodiment of the present invention.

Next, as shown in FIG. 19, after the removal of the photoresist film 20, the second gate insulating film 18 of the writing MIS transistor $Q_W$ is formed on the sidewall of the layered structure. The second gate insulating film 18 is formed by depositing a silicon oxide film above the substrate 1 by the CVD method. Alternatively, the second gate insulating film 18 may be formed by thermally oxidizing the surface of the polycrystalline silicon films constituting the layered structure.

Figure 20:
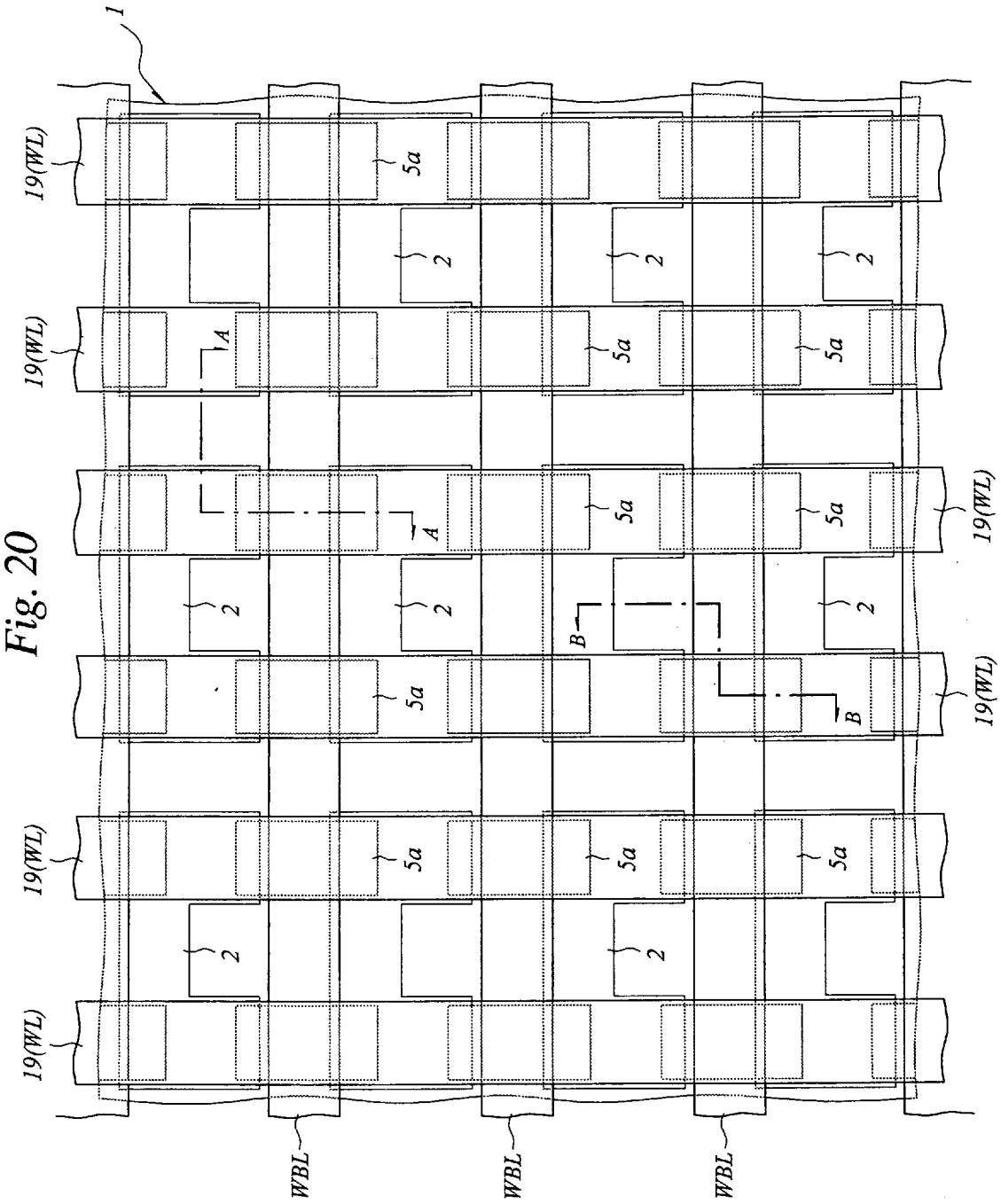
FIG. 20 is a plan view showing a method of manufacturing the semiconductor memory device according to the embodiment of the present invention.
Figure 21:
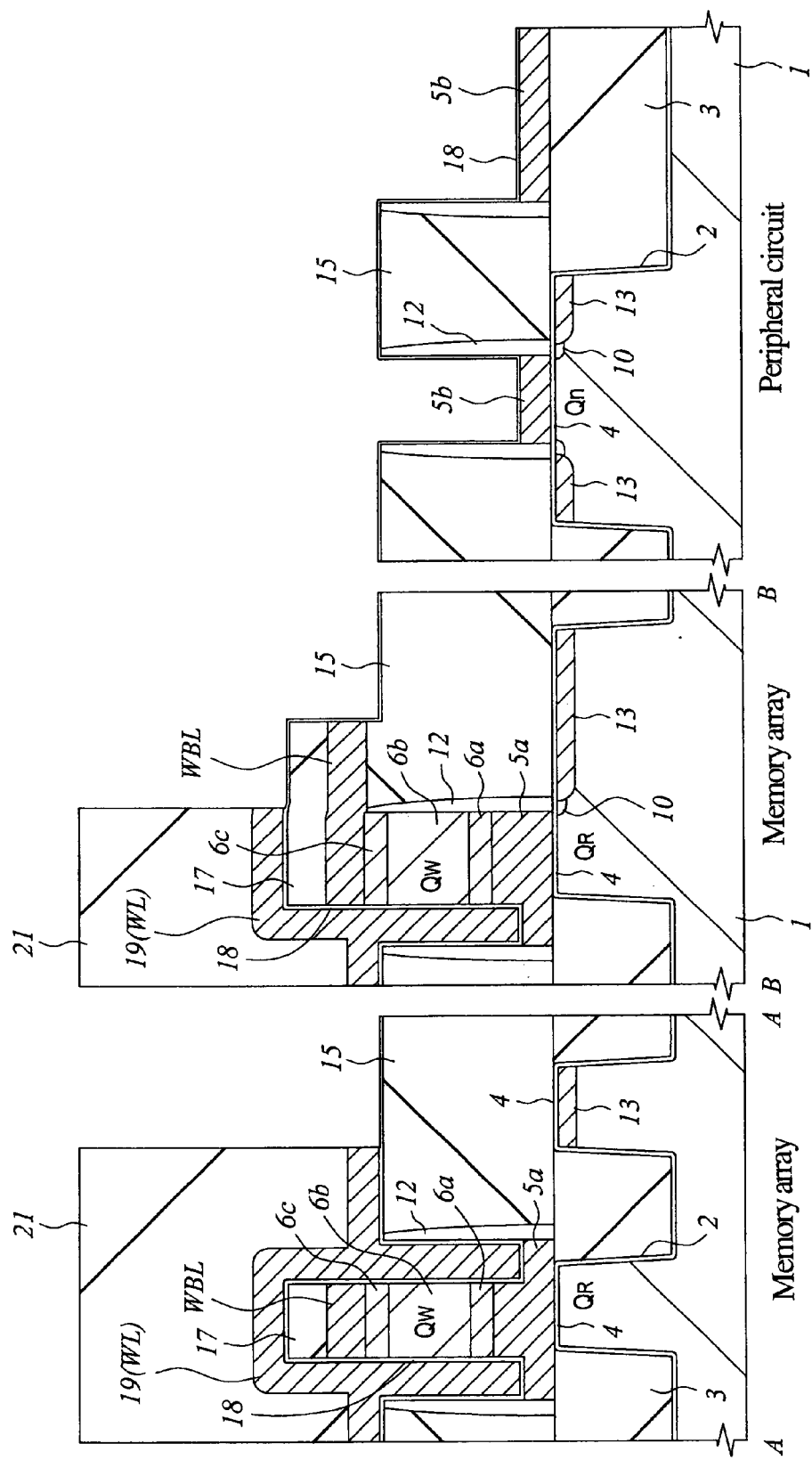
FIG. 21 is a plan view showing a method of manufacturing the semiconductor memory device according to the embodiment of the present invention.

Next, as shown in FIGS. 20 and 21, the second gate electrode 19 (word line WL) is formed on the second gate insulating film 18. Consequently, the writing MIS transistor $Q_W$ is almost completed. The second gate electrode 19 (word line WL) is formed by depositing an n type polycrystalline silicon film on the second gate insulating film 18 by the CVD method, and then patterning this polycrystalline silicon film by dry etching using a photoresist film 21 as a mask. In this dry etching, the etching should be stopped at a surface of the second gate insulating film 18 so as not to damage the gate electrode 5b of the peripheral circuit region. As shown in FIG. 20, the second gate electrodes 19 (word line WL) form a stripe-shaped flat pattern in which the second gate electrodes 19 extend in the column direction of the memory array region.

Figure 22:
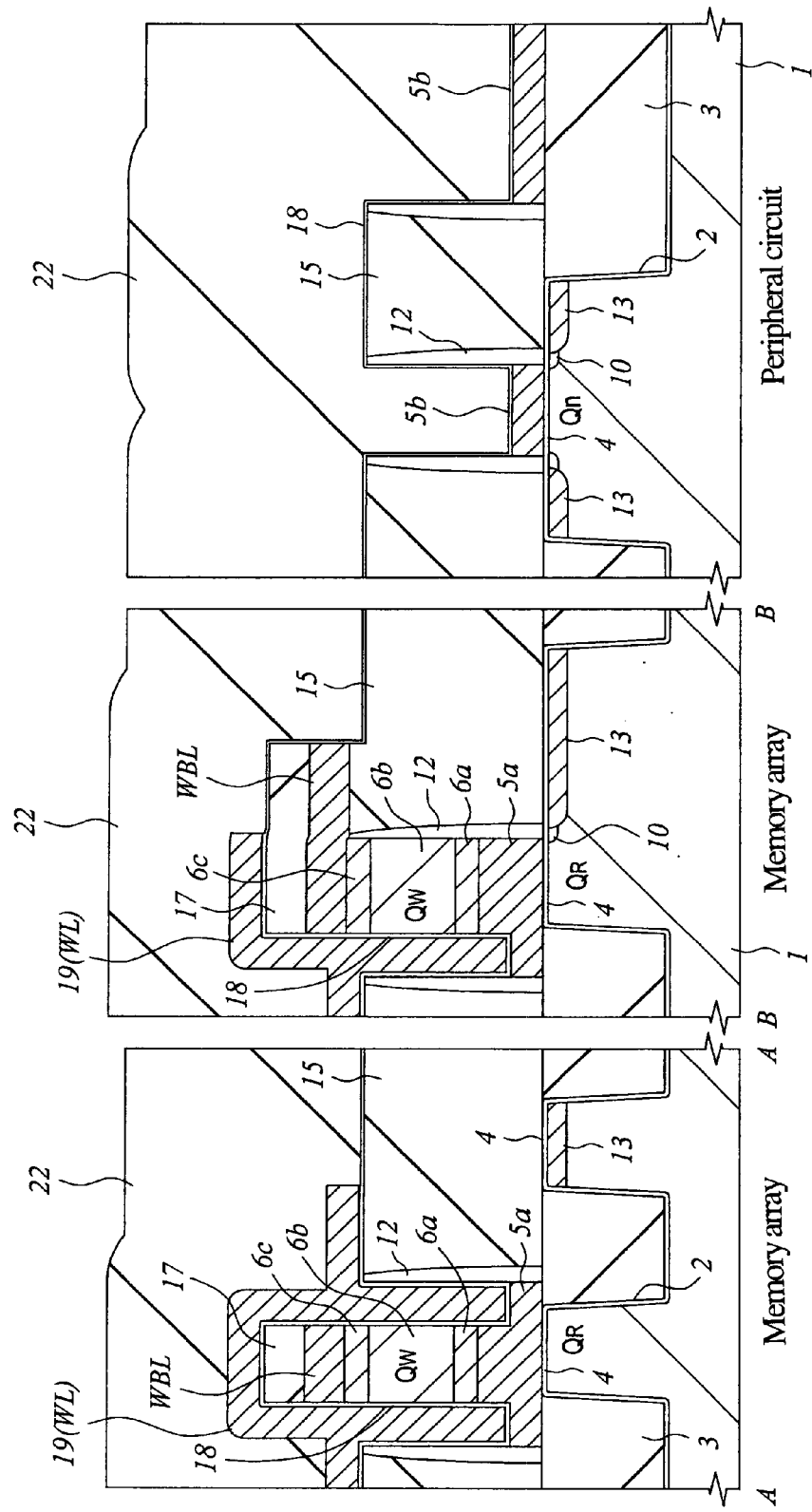
FIG. 22 is a plan view showing a method of manufacturing the semiconductor memory device according to the embodiment of the present invention.

Next, as shown in FIG. 22, after the removal of the photoresist film 21, a second interlayer insulating film 22 is formed on the second gate electrode 19 (word line WL). The second interlayer insulating film 22 is formed by depositing a silicon oxide film on the second gate electrode 19 (word line WL) by the CVD method.

Figure 23:
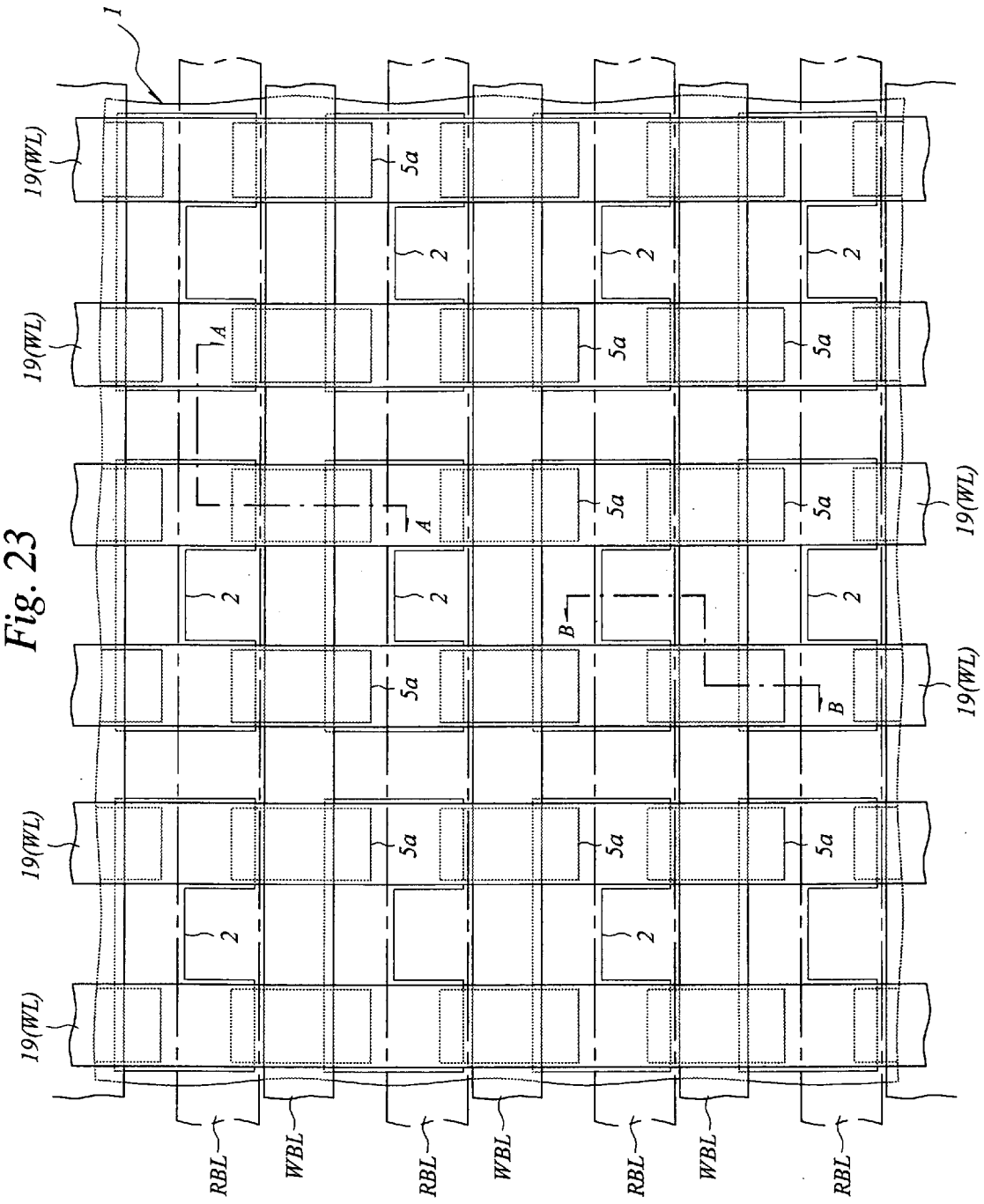
FIG. 23 is a plan view showing a method of manufacturing the semiconductor memory device according to the embodiment of the present invention.
Figure 24:
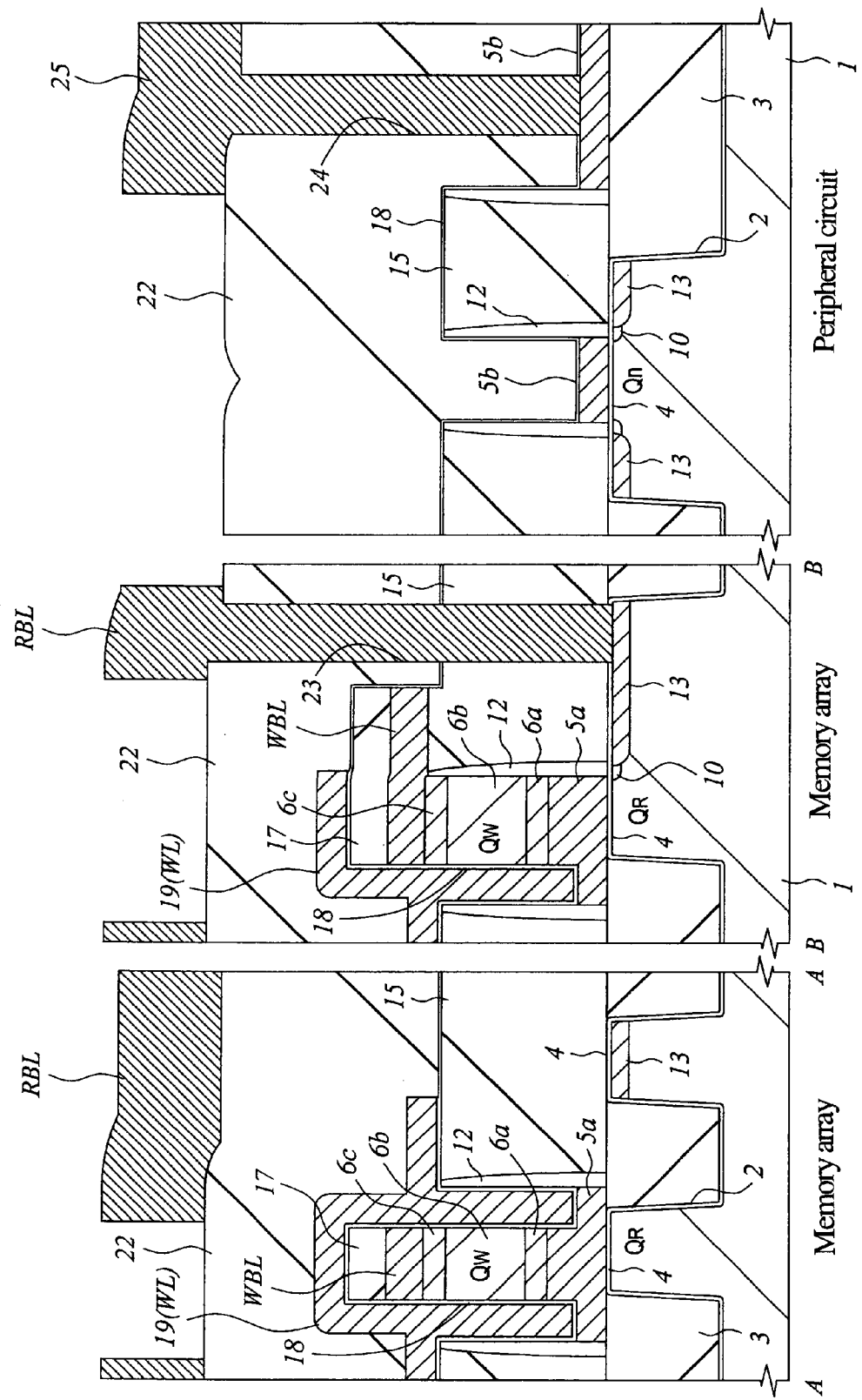
FIG. 24 is a plan view showing a method of manufacturing the semiconductor memory device according to the embodiment of the present invention.

Next, as shown in FIGS. 23 and 24, a reading bit line (second bit line) RBL electrically connected to the drain region (n⁺ type semiconductor region 13) of the reading MIS transistor $Q_R$ and a first wiring layer 25 electrically connected to the gate electrode 5b of the n channel type MIS transistor Qn are formed.

The reading bit line (second bit line) RBL and the first wiring layer 25 are formed by depositing an Al alloy film on the second interlayer insulating film 22 by the sputtering method, and then pattering this Al alloy film by dry etching using a photoresist film (not shown) as a mask. As shown in FIG. 23, the reading bit lines RBL form a stripe-shaped flat pattern in which the reading bit lines RBL extend in the column direction of the memory array region. In the manufacturing process so far, the memory cell shown in FIGS. 1 and 2 is completed.

(1) According to the manufacturing method described above, the semiconductor layer of the polycrystalline silicon film 5 serving as the first gate electrode of the reading MIS transistor and each of the semiconductor layers 6a, 6b, and 6c constituting the layered structure serving as the source-drain path of the writing MIS transistor are formed in the successive deposition process. Also, as shown in FIG. 10, since the semiconductor layer of the polycrystalline silicon film 5 and each of the semiconductor layers 6a, 6b, and 6c constituting the layered structure are patterned to form a square flat shape while being laminated on each other, the manufacturing process of the writing MIS transistor can be simplified.

(2) According to the manufacturing method described above, the layered structure and the polycrystalline silicon film 5 below the layered structure, which have been previously patterned to form a square flat shape, are etched to remove the lowermost polycrystalline silicon film 5 to approximately half the thickness thereof, thus forming the channel forming region of the writing MIS transistor and the convex portion of the first gate electrode 5a. Therefore, the substrate 1 is not damaged even if the first gate electrode 5a is a little overetched in the etching process thereof. Specifically, according to the above-described method of forming the layered structure and the first gate electrode 5a, the etching can be performed independently of the pattern of the element isolation trench 2 formed on the substrate 1. Therefore, even in the case where the layered structure and the first gate electrode 5a are made fine in size, the process margin thereof can be ensured.

(3) According to the above-described manufacturing method, since the first gate electrode 5a of the reading MIS transistor $Q_R$ and the gate electrode 5b of the n channel type MIS transistor $Q_n$ of the peripheral circuit are formed simultaneously, the manufacturing process thereof can be simplified.

(4) According to the above-described manufacturing method, a fine memory cell can be realized by the use of only the already-existing materials not using any novel materials such as high dielectrics (ferroelectric).

(5) Therefore, according to (1) to (4) described above, a semiconductor memory device having a fine memory cell therein can be fabricated at low cost.

(Second Embodiment)

Figure 25:
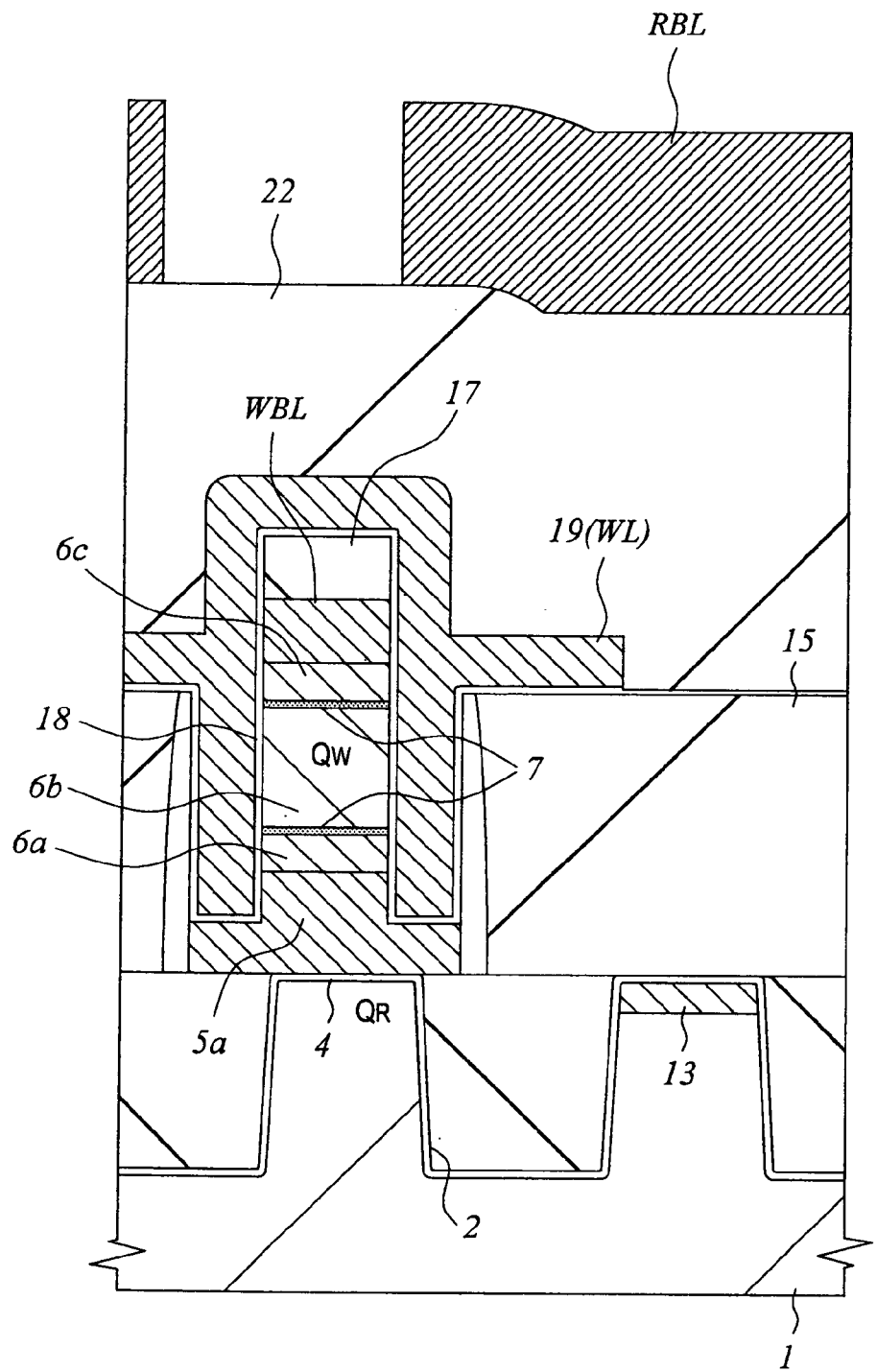
FIG. 25 is a cross-sectional view showing a memory cell of a semiconductor memory device according to another embodiment of the present invention.

As shown in FIG. 25, the memory cell according to this embodiment has a constitution in which a tunnel insulating film 7 is formed both between the lower semiconductor layer 6a constituting the source region of the writing MIS transistor $Q_W$ and the intermediate semiconductor layer 6b constituting the channel region thereof and between the intermediate semiconductor layer 6b and the upper semiconductor layer 6c constituting the drain region of the writing MIS transistor $Q_W$. These tunnel insulating films 7 effectively function as stoppers to prevent the impurities (phosphorus) in the lower and upper semiconductor layers 6a and 6c from diffusing into the intermediate semiconductor layer 6b having the impurities of low concentration due to the thermal treatment or the like in the fabrication of the memory cell. In order to flow the channel current between the source region (lower semiconductor layer 6a) and the drain region (upper semiconductor layer 6c) of the writing MIS transistor $Q_W$, these tunnel insulating films 7 are required to be formed of a film having a thin film thickness. The tunnel insulating film 7 is constituted of, for example, a silicon nitride film having a thickness of 2 nm to 3 nm deposited by the CVD method. In addition, since the use of this tunnel insulating film can reduce the leak current at the time when the transistor is turned off, the data holding characteristic can be improved.

Figure 26:
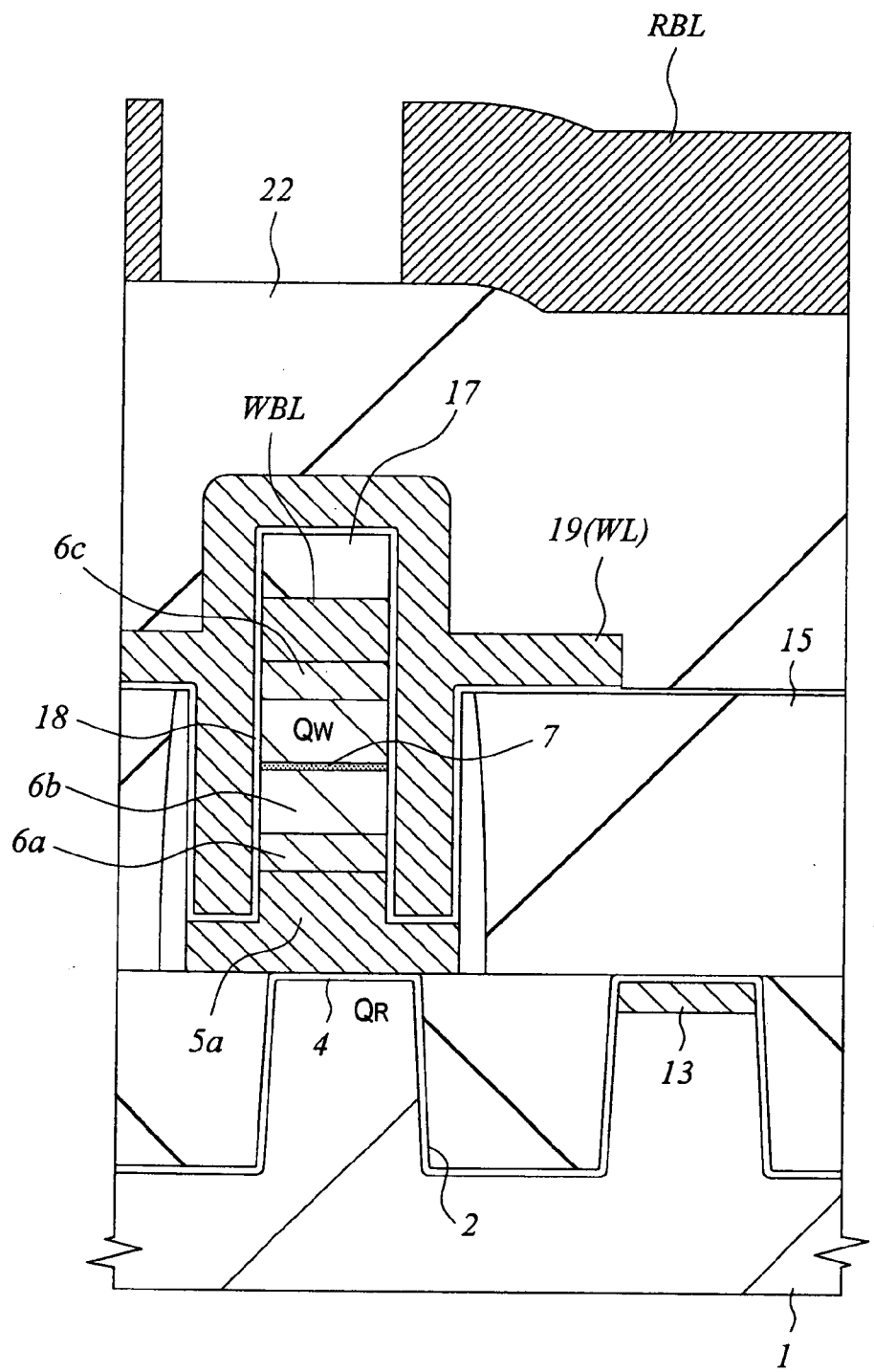
FIG. 26 is a cross-sectional view showing the memory cell of the semiconductor memory device according to another embodiment of the present invention.

FIG. 26 shows an example in which the tunnel insulating film 7 is formed at a halfway portion of the intermediate semiconductor layer 6b, which constitutes the channel region of the writing MIS transistor $Q_W$. This tunnel insulating film 7 functions as a stopper to prevent the carriers (electrons or holes) generated in the intermediate semiconductor layer 6b of the writing MIS transistor $Q_W$ in the OFF state from flowing between the source and the drain regions as a current. That is, the tunnel insulating film 7 is effectively used to reduce the off-current of the writing MIS transistor $Q_W$. This tunnel insulating film 7 is not limited to a single layer, and a plurality of tunnel insulating films 7 may be used.

Figure 27:
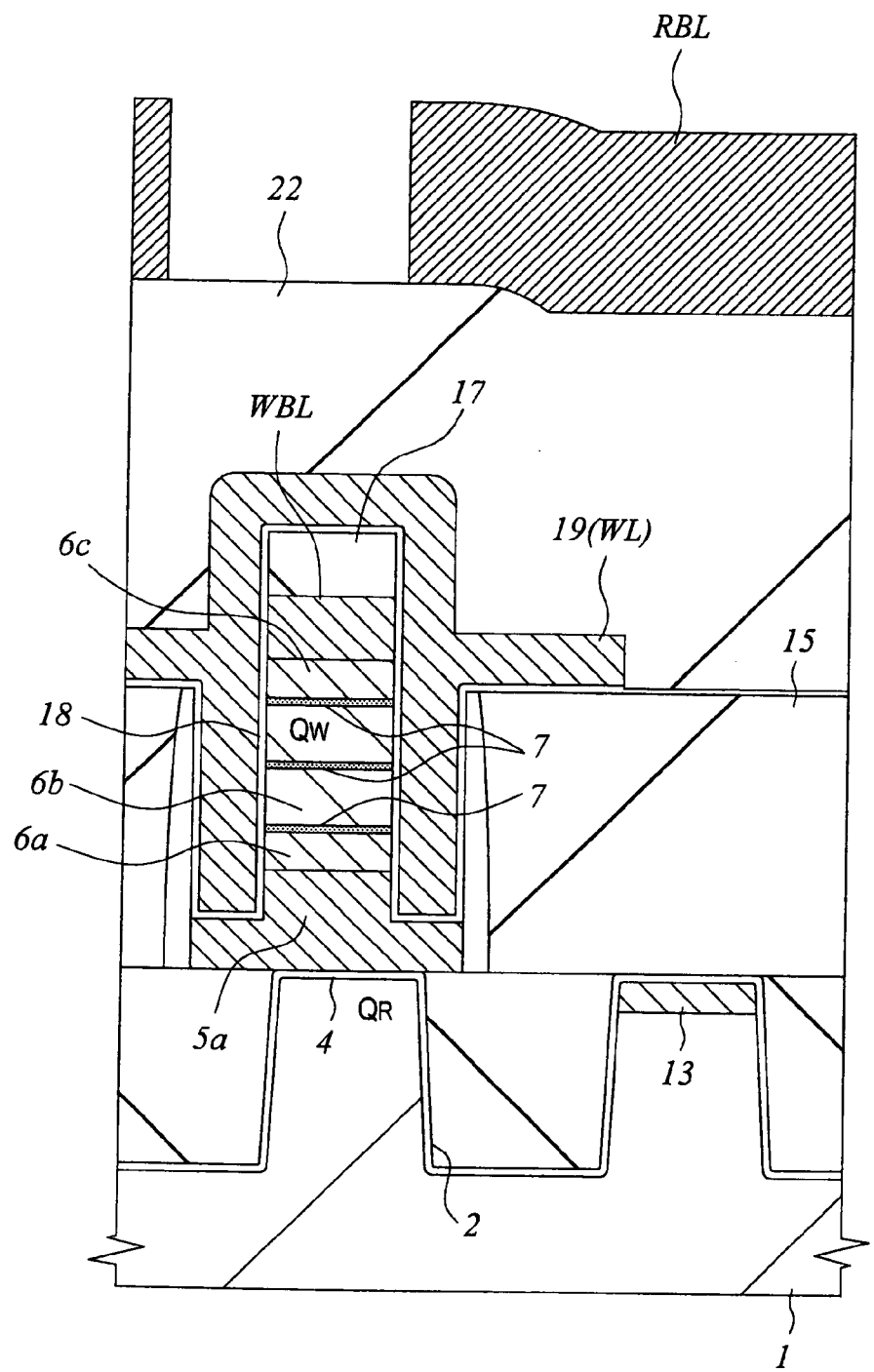
FIG. 27 is a cross-sectional view showing the memory cell of the semiconductor memory device according to another embodiment of the present invention.

As shown in FIG. 27, if the tunnel insulating film 7 is formed between the lower semiconductor layer 6a and the intermediate semiconductor layer 6b, at the halfway portion of the intermediate semiconductor layer 6b, and between the intermediate semiconductor layer 6b and the upper semiconductor layer 6c of the writing MIS transistor $Q_W$, the advantages of both examples shown in FIGS. 25 and 26 can be obtained.

Also, in the case where the above-described tunnel insulating film 7 formed of the silicon nitride film is interposed at a halfway portion of the layered structure constituted of the lower semiconductor layer 6a, the intermediate semiconductor layer 6b, and the upper semiconductor layer 6c, the tunnel insulating film 7 can be utilized as an etching stopper when the layered structure and the polycrystalline silicon film 5 below the layered structure are etched to form the first gate electrode 5a of the reading MIS transistor $Q_R$ and the gate electrode 5b of the MIS transistor of the peripheral circuit in the process shown in FIG. 18. Therefore, the first gate electrode 5a and the gate electrode 5b can be machined with high accuracy.

In the foregoing, the inventions made by the inventors have been concretely described based on the embodiments. However, it goes without saying that the present invention is not limited to this and various modifications and alterations without departing from the scope of the invention can be made.

In the above-described embodiments, the first gate electrode 5a of the reading MIS transistor $Q_R$, the second gate electrode 19 (word line WL) of the writing MIS transistor $Q_W$, and the writing bit line WBL are formed of the polycrystalline silicon film, respectively. However, they can be formed of a layered film (polycide film) made of, for example, a polycrystalline silicon film and a metal silicide film.

Although then channel type MOS transistor was only the example of the MOS transistor constituting the peripheral circuit in the above-described embodiments, it is a matter of course that the peripheral circuit may be constituted by combining the n channel type MOS transistor and the p channel type MOS transistor.

The advantages achieved by the typical ones of the inventions disclosed in this application will be briefly described as follows.

According to the present invention, a semiconductor memory device having a memory cell structure which can be easily made fine can be realized.

According to the present invention, a semiconductor memory device having a memory cell structure which can be easily made fine can be fabricated at low cost.

What is claimed is:

1. A semiconductor memory device, comprising:
a memory array region constituted of a plurality of memory cells formed in matrix on a main surface of a semiconductor substrate,
wherein each of said plurality of memory cells comprises: a reading MIS transistor having a source region and a drain region formed on the main surface of said semiconductor substrate, a channel forming region formed on the main surface of said semiconductor substrate between said source region and said drain region, and a first gate electrode formed above the main surface of said semiconductor substrate of said channel forming region via a first gate insulating film; and a writing MIS transistor having a source region, a channel forming region, and a drain region formed in a layered structure, which are arranged on the first gate electrode of said reading MIS transistor and extends in the vertical direction to the main surface of said semiconductor substrate, said writing MIS transistor also having a second gate electrode formed on a sidewall of said layered structure via a second gate insulating film,
the first gate electrode of said reading MIS transistor has both end portions in the column direction, which terminate on an element isolation regions, and is formed so as to have a convex-shaped cross section in the column direction,
a length of said layered structure in the column direction is shorter than that of said first gate electrode in the column direction,
a first bit line electrically connected to the drain region of said writing MIS transistor is formed on said layered structure, and
a second bit line electrically connected to either of the source region or the drain region of said reading MIS transistor is formed on said first bit line.

2. The semiconductor memory device according to claim 1, wherein said layered structure comprises: a lower semiconductor layer constituting the source region of said writing MIS transistor; an intermediate semiconductor layer constituting the channel forming region thereof; and an upper semiconductor layer constituting the drain region thereof.

3. The semiconductor memory device according to claim 2, wherein each of said lower semiconductor layer, said intermediate semiconductor layer, and said upper semiconductor layer is made of a silicon film, respectively.

4. The semiconductor memory device according to claim 1, wherein a length of said first bit line in the column direction is equal to that of said layered structure in the column direction.

5. The semiconductor memory device according to claim 1, wherein each of said layered structure and said first bit line has one end portion in the column direction, which terminates on the element isolation region, and the other end portion in the column direction, which terminates on an active region.

6. The semiconductor memory device according to claim 1, wherein each of said first bit lines and said second bit lines forms a stripe-shaped flat pattern extending in the row direction of said memory array region, and said second gate electrode forms a stripe-shaped flat pattern extending in the column direction of said memory array region.

7. The semiconductor memory device according to claim 1, wherein each of the first gate electrode of said reading MIS transistor, the second gate electrode and said first bit line of said writing MIS transistor is made of a polycrystalline silicon film, and said second bit line is made of a metal film.

8. The semiconductor memory device according to claim 1, wherein a tunnel insulating film is interposed each between said lower semiconductor layer constituting the source region of said writing MIS transistor and said intermediate semiconductor layer constituting the channel forming region thereof and between said intermediate semiconductor layer and said upper semiconductor layer constituting the drain region of said writing MIS transistor.

9. The semiconductor memory device according to claim 8, wherein a tunnel insulating film is further interposed in a halfway portion of said intermediate semiconductor layer constituting the channel forming region of said writing MIS transistor.

10. The semiconductor memory device according to claim 1, wherein a tunnel insulating film is interposed in a halfway portion of said intermediate semiconductor layer constituting the channel forming region of said writing MIS transistor.

11. The semiconductor memory device according to claim 8, wherein said tunnel insulating film is made of a silicon nitride film.

12. The semiconductor memory device according to claim 1, wherein said reading MIS transistor and said writing MIS transistor are n channel type MIS transistors.

13. The semiconductor memory device according to claim 1, wherein a gate electrode of the MIS transistor comprising a peripheral circuit in the main surface of said semiconductor substrate and constituting said peripheral circuit is constituted of a conductive layer identical to the conductive layer constituting the first gate electrode of said reading MIS transistor.

14. The semiconductor memory device according to claim 13, wherein the gate electrode of the MIS transistor constituting said peripheral circuit has a thickness lower than that of the first gate electrode of said reading MIS transistor.

15. The semiconductor memory device according to claim 3, wherein said intermediate semiconductor layer is made of a pure silicon film substantially having no impurities therein.

16. The semiconductor memory device according to claim 3, wherein said intermediate semiconductor layer is constituted by comprising a double-layered film made of a silicon film and a thin insulating film serving as a tunnel film for electrons.

* * * * *

UNITED STATES PATENT AND TRADEMARK OFFICE
CERTIFICATE OF CORRECTION

PATENT NO.    : 6,501,116 B2
DATED         : December 31, 2002
INVENTOR(S)   : Kisu et al.

It is certified that error appears in the above-identified patent and that said Letters Patent is hereby corrected as shown below:

<u>Title page,</u>
Item [73], Assignee, please add between "Hitachi, Ltd.," and "Tokyo (JP)"
-- and Hitachi ULSI Systems Co., Ltd., respectively Tokyo (JP) and Kodaira-shi, --.

Signed and Sealed this

Second Day of September, 2003

JAMES E. ROGAN
*Director of the United States Patent and Trademark Office*